(12) United States Patent
Hatta et al.

(10) Patent No.: US 12,435,423 B2
(45) Date of Patent: Oct. 7, 2025

(54) SUBSTRATE PROCESSING METHOD, METHOD OF MANUFACTURING SEMICONDUCTOR DEVICE, SUBSTRATE PROCESSING APPARATUS AND NON-TRANSITORY COMPUTER-READABLE RECORDING MEDIUM

(71) Applicant: Kokusai Electric Corporation, Tokyo (JP)

(72) Inventors: Hiroki Hatta, Toyama (JP); Yuji Takebayashi, Toyama (JP); Yusaku Okajima, Toyama (JP); Shota Tanaka, Toyama (JP)

(73) Assignee: Kokusai Electric Corporation, Tokyo (JP)

(*) Notice: Subject to any disclaimer, the term of this patent is extended or adjusted under 35 U.S.C. 154(b) by 581 days.

(21) Appl. No.: 17/879,048

(22) Filed: Aug. 2, 2022

(65) Prior Publication Data

US 2023/0091850 A1  Mar. 23, 2023

(30) Foreign Application Priority Data

Sep. 21, 2021  (JP) ................. 2021-153180

(51) Int. Cl.
  *C23C 16/52* (2006.01)
  *C23C 16/455* (2006.01)
  *H01L 21/02* (2006.01)
(52) U.S. Cl.
  CPC ........ *C23C 16/52* (2013.01); *C23C 16/45546* (2013.01); *C23C 16/45553* (2013.01); *H01L 21/02126* (2013.01); *H01L 21/0228* (2013.01)
(58) Field of Classification Search
  CPC .............. C23C 16/52; C23C 16/45546; C23C 16/45553
  See application file for complete search history.

(56) References Cited

U.S. PATENT DOCUMENTS

2011/0124204 A1    5/2011  Ota et al.
2014/0045278 A1*   2/2014  Yoshida .................. C23C 16/54
                                                                438/5

(Continued)

FOREIGN PATENT DOCUMENTS

JP    2011-129879 A    6/2011
JP    2017-157744 A    9/2017
JP    2019-091819 A    6/2019

OTHER PUBLICATIONS

Habuka, Yokohama, et al., "Silicon Epitaxial Growth Rate and Transport Phenomena in a Vertical Stacked-Type Multi-Wafer Reactor". Japanese Journal of Applied Physics, 51, 026701 (2012) pp. 1-5.*

(Continued)

*Primary Examiner* — Bret P Chen
(74) *Attorney, Agent, or Firm* — Volpe Koenig

(57) ABSTRACT

There is provided a technique capable of improving a step coverage performance of a film formed on a substrate. According to one aspect thereof, there is provided a substrate processing method including: (a1) supplying a first process gas such that a transfer velocity of the first process gas toward an edge region of a substrate is faster than the transfer velocity of the first process gas toward a central region of the substrate; (a2) supplying a second process gas such that a transfer velocity of the second process gas toward the central region of the substrate is faster than the transfer velocity of the second process gas toward the edge region of the substrate; and (b) supplying a reactive gas toward the substrate.

19 Claims, 14 Drawing Sheets

(56) References Cited

U.S. PATENT DOCUMENTS

| | | |
|---|---|---|
| 2017/0253969 A1 | 9/2017 | Inaba et al. |
| 2017/0275759 A1* | 9/2017 | Kurita ............... C23C 16/45591 |
| 2019/0145006 A1 | 5/2019 | Kitamura et al. |

OTHER PUBLICATIONS

Li, Zhenjiang, et al., "Simulation study on the influence of distribution of temperature, gas f low rate and gas component on SiC nanowires grew in self-designed CVD reaction chamber". Computational Materials Science 96 (2015) 63-68.*

Yan, Wen, et al., "Gas flow rate dependence of the discharge characteristics of a helium atmospheric pressure plasma jet interacting with a substrate". J. Phys. D: Appl. Phys. 50 (2017) 415205 pp. 1-13.*

Japanese Office Action issued on Jan. 30, 2023 for Japanese Patent Application No. 2021-153180.

\* cited by examiner

SUBSTRATE PROCESSING METHOD, METHOD OF MANUFACTURING SEMICONDUCTOR DEVICE, SUBSTRATE PROCESSING APPARATUS AND NON-TRANSITORY COMPUTER-READABLE RECORDING MEDIUM

CROSS-REFERENCE TO RELATED PATENT APPLICATION

This non-provisional U.S. patent application claims priority under 35 U.S.C. § 119 of Japanese Patent Application No. 2021-153180, filed on Sep. 21, 2021, in the Japanese Patent Office, the entire contents of which are hereby incorporated by reference.

BACKGROUND

1. Field

The present disclosure relates to a substrate processing method, a method of manufacturing a semiconductor device, a substrate processing apparatus and a non-transitory computer-readable recording medium.

2. Related Art

According to some related arts, as a part of a manufacturing process of a semiconductor device, an inert gas or a hydrogen-containing gas is supplied toward a substrate together with a source gas. Thereby, it is possible to set a flow velocity of the source gas flowing in a direction parallel to a surface of the substrate to be greater than a flow velocity of the inert gas flowing in the direction parallel to the surface of the substrate in a step of purging an inside of a process vessel.

In recent years, an aspect ratio of a concave structure (or a recess) such as a groove formed on the substrate may increase in accordance with a reduction of a cell area due to a miniaturization of a device such as the semiconductor device, and it is preferable to improve a step coverage performance, for example, when a film is formed on the substrate provided with a deeper concave structure. In order to improve the step coverage performance, it is preferable to sufficiently supply a gas such as the source gas to a lower portion of the concave structure. Further, in order to improve the step coverage performance, while sufficiently supplying the gas to the lower portion of the concave structure, it is preferable to suppress a supply amount of a process gas such as the source gas to an upper portion of the device.

SUMMARY

According to the present disclosure, there is provided a technique capable of improving a step coverage performance of a film formed on a substrate.

According to one aspect of the technique of the present disclosure, there is provided a substrate processing method including: (a1) supplying a first process gas such that a transfer velocity of the first process gas toward an edge region of a substrate is faster than the transfer velocity of the first process gas toward a central region of the substrate; (a2) supplying a second process gas such that a transfer velocity of the second process gas toward the central region of the substrate is faster than the transfer velocity of the second process gas toward the edge region of the substrate; and (b) supplying a reactive gas toward the substrate.

DETAILED DESCRIPTION

Embodiments

Figure 1:
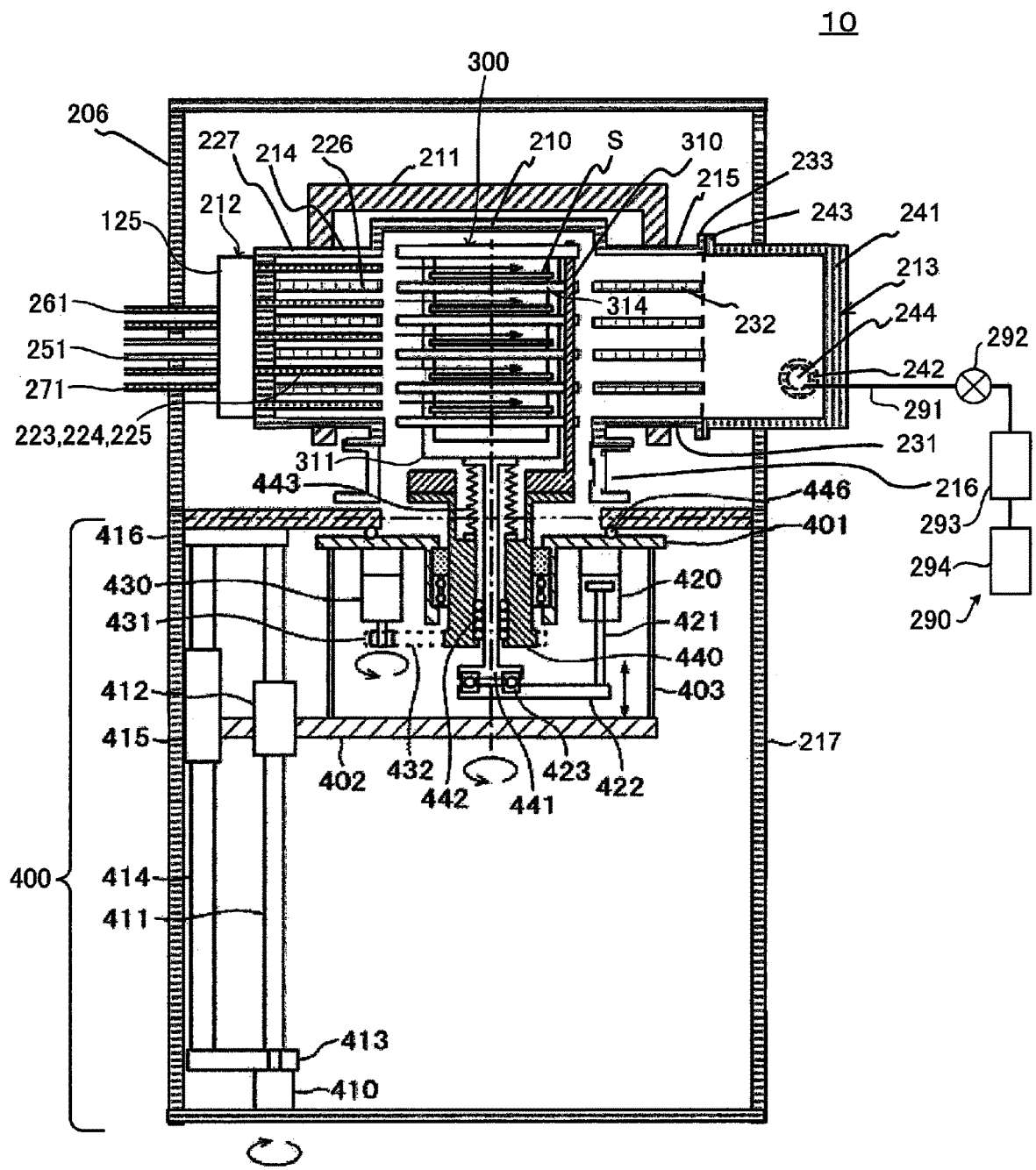
FIG. 1 is a diagram schematically illustrating a vertical cross-section of a substrate processing apparatus according to one or more embodiments of the present disclosure.

Hereinafter, one or more embodiments (also simply referred to as "embodiments") according to the technique of the present disclosure will be described mainly with reference to FIGS. 1 through 13. The drawings used in the following descriptions are all schematic. For example, a relationship between dimensions of each component and a ratio of each component shown in the drawing may not always match the actual ones. Further, even between the drawings, the relationship between the dimensions of each component and the ratio of each component may not always match.

(1) Configuration of Substrate Processing Apparatus

A configuration of a substrate processing apparatus 10 according to the present embodiments will be described mainly with reference to FIG. 1.

The substrate processing apparatus 10 includes a reaction tube storage chamber 206. In the reaction tube storage chamber 206, a reaction tube 210 of a cylindrical shape extending in a vertical direction, a heater 211 serving as a heating structure (furnace body) installed on an outer periphery of the reaction tube 210, a gas supply structure 212 serving as a part of a gas supplier (which is a gas supply system), and a gas exhaust structure 213 serving as a part of a gas exhauster (which is a gas exhaust system) are provided. The gas supplier may further include an upstream side gas guide 214 or nozzles 223, 224 and 225, which will be described later. Further, the gas exhauster may further include a downstream side gas guide 215, which will be described later.

The gas supply structure 212 is provided upstream in a gas flow direction of the reaction tube 210, and a gas such as a source gas and a reactive gas is supplied into the reaction tube 210 through the gas supply structure 212. Then, the gas is supplied to a substrate S in a horizontal direction. The gas exhaust structure 213 is provided downstream in the gas flow direction of the reaction tube 210, and the gas in the reaction tube 210 is discharged through the gas exhaust structure 213. The gas supply structure 212, an inner portion of the reaction tube 210 and the gas exhaust structure 213 communicate with one another in the horizontal direction.

On an upstream side of the reaction tube 210 between the reaction tube 210 and the gas supply structure 212, the upstream side gas guide 214 configured to adjust a flow of the gas supplied through the gas supply structure 212 is provided. Further, on a downstream side of the reaction tube 210 between the reaction tube 210 and the gas exhaust structure 213, the downstream side gas guide 215 configured to adjust the flow of the gas discharged from the reaction tube 210 is provided. A lower end of the reaction tube 210 is supported by a manifold 216.

The reaction tube 210, the upstream side gas guide 214 and the downstream side gas guide 215 are implemented as a continuous structure. For example, each of the reaction tube 210, the upstream side gas guide 214 and the downstream side gas guide 215 is made of a material such as quartz and silicon carbide (SiC). Further, each of the reaction tube 210, the upstream side gas guide 214 and the downstream side gas guide 215 is constituted by a heat permeable structure capable of transmitting a heat radiated from the heater 211. The heat of the heater 211 can heat the substrate S and the gas.

The gas supply structure 212 is connected to each of a gas supply pipe 251, a gas supply pipe 261 and a gas supply pipe 271, and includes a distribution structure 125 configured to distribute the gas supplied through each gas supply pipe described above. The nozzle 223, the nozzle 224 and the nozzle 225 are provided at a downstream side of the distribution structure 125. The nozzle 223, the nozzle 224 and the nozzle 225 are connected to downstream sides of the gas supply pipe 251, the gas supply pipe 261 and the gas supply pipe 271, respectively, through the distribution structure 125. The nozzle 223, the nozzle 224 and the nozzle 225 are arranged side by side in a lateral direction, each of which extends substantially horizontally. Further, a plurality of nozzles including the nozzle 223, a plurality of nozzles including the nozzle 224 and a plurality of nozzles including the nozzle 225 are arranged in the vertical direction at positions corresponding to a plurality of substrates including the substrate S, respectively. Hereafter, the plurality of nozzles including the nozzle 223 may also be simply referred to as nozzles 223, the plurality of nozzles including the nozzle 224 may also be simply referred to as nozzles 224, the plurality of nozzles including the nozzle 225 may also be simply referred to as nozzles 225, and the plurality of substrates including the substrate S may also be simply referred to as substrates S. Each of the nozzles 223, 224 and 225 may also be referred to as a gas ejection structure.

The distribution structure 125 is configured such that each gas can be supplied to the nozzles 223 through the gas supply pipe 251, to the nozzles 224 through the gas supply pipe 261 and to the nozzles 225 through the gas supply pipe 271. For example, a gas flow path can be provided for each combination of the gas supply pipe and the nozzle corresponding to the gas supply pipe. Thereby, since the gases supplied through the gas supply pipes described above are not mixed, it is possible to suppress a generation of particles that may be generated when the gases are mixed in the distribution structure 125.

The upstream side gas guide 214 includes a housing 227 and a partition plate 226. The partition plate 226 extends in the horizontal direction. The "horizontal direction" of the partition plate 226 may refer to a direction toward a side wall of the housing 227. A plurality of partition plates including the partition plate 226 are arranged in the vertical direction. Hereafter, the plurality of partition plates including the partition plate 226 may also be simply referred to as partition plates 226. The partition plate 226 is fixed to the side wall of the housing 227 such that it is possible to prevent the gas from flowing into an adjacent region below or above the partition plate 226. By preventing the gas from flowing into the adjacent region, it is possible to reliably form a gas flow described later.

The partition plate 226 is a continuous structure extending in the horizontal direction and provided without a hole. The partition plates 226 are provided at positions corresponding to the substrates S, respectively. The nozzle 223, the nozzle 224 and the nozzle 225 are arranged between adjacent partition plates 226 or between the partition plate 226 and the housing 227.

The gas ejected through the nozzle 223, the nozzle 224 and the nozzle 225 is supplied to a surface of the substrate S. That is, when viewed from the substrate S, the gas is supplied along a lateral direction of the substrate S. Since the partition plate 226 is stretched in the horizontal direction and has a continuous structure without holes, the mainstream of the gas is restrained from moving in the vertical direction and is moved in the horizontal direction. Therefore, the pressure loss of the gas reaching each substrate S can be made uniform over the vertical direction.

The downstream side gas guide 215 is configured such that a ceiling thereof is provided above an uppermost substrate S among the substrates S supported by a substrate support 300 described later, and a bottom thereof is provided below a lowermost substrate S among the substrates S supported by the substrate support 300. The substrate support 300 is used as a substrate retainer where the substrates S are accommodated.

The downstream side gas guide 215 includes a housing 231 and a partition plate 232. The partition plate 232 extends in the horizontal direction. The "horizontal direction" of the partition plate 232 may refer to a direction toward a side wall of the housing 231. Further, a plurality of partition plates including the partition plate 232 are arranged in the vertical direction. Hereafter, the plurality of partition plates including the partition plate 232 may also be simply referred to as partition plates 232. The partition plate 232 is fixed to the side wall of the housing 231 such that it is possible to prevent the gas from flowing into an adjacent region below or above the partition plate 232. By preventing the gas from flowing into the adjacent region, it is possible to reliably form the gas flow described later. A flange 233 is provided on a portion of the housing 231 that comes into contact with the gas exhaust structure 213.

The partition plate 232 is a continuous structure extending in the horizontal direction and provided without a hole. The partition plates 232 are provided at positions corresponding to the substrates S and corresponding to the partition plates 226, respectively. It is preferable that the partition plate 226 and the partition plate 232 corresponding to the partition plate 226 are provided at the same height. Further, when processing the substrate S, it is preferable that the substrate S, the partition plate 226 corresponding to the substrate S and the partition plate 232 corresponding to the partition plate 226 are provided at the same height. With such a structure, the gas flow in the horizontal direction passing over the substrate S and the partition plate 232 is formed by the gas supplied through each nozzle, as shown by each arrow in the drawing. By configuring the partition plate 232 as described above, it is possible to uniformize the pressure loss of the gas ejected (or discharged) through each of the substrates S. Therefore, the flow of the gas passing through each of the substrates S is formed in the horizontal direction toward the gas exhaust structure 213 while suppressing a gas flow in the vertical direction.

By providing the partition plates 226 and the partition plates 232, it is possible to uniformize the pressure loss in the vertical direction at both an upstream and a downstream of each of the substrates S. As a result, it is possible to reliably form a horizontal gas flow in which the flow along the vertical direction is suppressed by the partition plate 226, the substrate S and the partition plate 232.

The gas exhaust structure 213 is provided downstream of the downstream side gas guide 215. The gas exhaust structure 213 is constituted mainly by a housing 241 and a gas exhaust pipe connection structure 242. A flange 243 is provided on a portion of the housing 241 adjacent to the downstream side gas guide 215. Since the gas exhaust structure 213 is made of a metal and the downstream side gas guide 215 is made of quartz, the flange 233 and the flange 243 are fixed to each other with a fixing structure such as a screw via a cushioning material such as an O-ring. It is preferable that the flange 243 is arranged outside the heater 211 such that an influence of the heater 211 on the O-ring can be suppressed.

The gas exhaust structure 213 communicates with a space of the downstream side gas guide 215. The upper ends of the housing 231 and the housing 241 form a continuous structure. That is, a height of a ceiling of the housing 231 is configured to be the same as that of a ceiling of the housing 241, and a height of a bottom of the housing 231 is configured to be the same as that of a bottom of the housing 241. An exhaust hole 244 is provided at a downstream side of the housing 241 on a lower portion of the housing 241 or in the horizontal direction. The gas exhaust structure 213 is provided in a lateral direction of the reaction tube 210, and is a lateral exhaust structure configured to exhaust the gas along the lateral direction of the substrate S.

The gas that has passed through the downstream side gas guide 215 is exhausted through the exhaust hole 244. When the gas is exhausted through the exhaust hole 244, since the gas exhaust structure 213 is not provided with a structure similar to the partition plate described above, the gas flow whose vertical component is non-zero is formed toward the exhaust hole 244.

The substrate support 300 includes a partition plate support 310 and a base structure 311, and is accommodated in the reaction tube 210. The substrates S are arranged directly below an inner wall of a top plate of the reaction tube 210. Further, the substrate support 300 is configured to perform a process such as a process of transferring the substrate S by a vacuum transfer robot in a transfer chamber 217 via a substrate loading/unloading port (not shown) and a process of loading the transferred substrate S into the reaction tube 210 such that a film-forming step of forming a film on the surface of the substrate S can be performed. For example, the substrate loading/unloading port is provided on a side wall of the transfer chamber 217.

A plurality of partition plates including a partition plate 314 of a disk shape are fixed to the partition plate support 310 at a predetermined pitch. Hereafter, the plurality of partition plates including the partition plate 314 may also be simply referred to as partition plates 314. Each of the substrates S is supported between its adjacent partition plates 314 such that the substrates S are arranged at a predetermined interval therebetween. The partition plate 314 is arranged directly below the substrate S. The partition plates 314 may be provided above or below their adjacent substrates S. Alternatively, the partition plates 314 may be provided above and below their adjacent substrates S. The partition plates 314 are configured to separate spaces between adjacent substrates S from one another.

The substrates S are placed on the substrate support 300 at the predetermined interval. The predetermined interval between the substrates S placed on the substrate support 300 is the same as a vertical interval (that is, the pitch described above) of the partition plates 314 fixed to the partition plate support 310. Further, a diameter of the partition plate 314 is set to be larger than a diameter of the substrate S.

The substrate support 300 is configured to support a plurality of substrates (for example, 5 substrates) as the substrates S in a multistage manner in the vertical direction. The present embodiments will be described by way of an example in which 5 substrates are supported by the substrate support 300 as the substrates S. However, the present embodiments are not limited thereto. For example, the substrate support 300 may be configured to support about 5 substrates to 50 substrates as the substrates S. Further, the partition plate 314 of the partition plate support 310 may also be referred to as a "separator".

The substrate support 300 is driven by a vertical driving structure 400 in the vertical direction between the reaction tube 210 and the transfer chamber 217 and in a rotational direction around a center of the substrate S supported by the substrate support 300.

The transfer chamber 217 is installed in a lower portion of the reaction tube 210 via the manifold 216. In the transfer chamber 217, the substrate S may be transferred to (or placed on) the substrate support (hereinafter, may also be simply referred to as a "boat") 300 by the vacuum transfer robot via the substrate loading/unloading port, or the substrate S may be transferred out of the substrate support 300 by the vacuum transfer robot.

In the transfer chamber 217, the vertical driving structure 400 constituting a first driving structure configured to drive the substrate support 300 in the vertical direction and the rotational direction may be stored. FIG. 1 schematically illustrates a state in which the substrate support 300 is elevated by the vertical driving structure 400 and stored in the reaction tube 210.

The vertical driving structure 400 constituting the first driving structure includes: as drive sources, a vertical driving motor 410; a rotational driving motor 430; and a boat vertical driving structure 420 provided with a linear actuator serving as a substrate support elevator capable of driving the substrate support 300 in the vertical direction.

By rotationally driving a ball screw 411, the vertical driving motor 410 serving as a partition plate support elevator moves a nut 412 screwed with respect to the ball screw 411 in the vertical direction along the ball screw 411. As a result, the partition plate support 310 and the substrate support 300 are driven in the vertical direction between the reaction tube 210 and the transfer chamber 217 together with a base plate 402 fixing the nut 412. The base plate 402 is also fixed to a ball guide 415 that is engaged with a guide shaft 414, and is configured to be capable of being smoothly moved in the vertical direction along the guide shaft 414. An upper end portion and a lower end portion of each of the guide shaft 414 and the ball screw 411 are fixed to fixing plates 416 and 413, respectively.

The rotational driving motor 430 and the boat vertical driving structure 420 provided with the linear actuator constitute a second driving structure, and are fixed to a base flange 401 serving as a lid supported by a side plate 403 on the base plate 402.

The rotational driving motor 430 is configured to drive a rotation transmission belt 432 that engages with a tooth structure 431 attached to a front end (tip) thereof, and is configured to rotationally drive a support 440 that engages with the rotation transmission belt 432. The support 440 is configured to support the partition plate support 310 by the base structure 311, and is configured to rotate the partition plate support 310 and the substrate support 300 by being driven by the rotational driving motor 430 via the rotation transmission belt 432.

The boat vertical driving structure 420 provided with the linear actuator is configured to drive a shaft 421 in the vertical direction. A plate 422 is attached to a front end (tip) of the shaft 421. The plate 422 is connected to a support 441 fixed to the substrate support 300 via a bearing 423. By connecting the support 441 to the plate 422 via the bearing 423, when the partition plate support 310 is rotationally driven by the rotational driving motor 430, it is possible to rotate the substrate support 300 together with the partition plate support 310.

On the other hand, the support 441 is supported by the support 440 via a linear guide bearing 442. With such a configuration, when the shaft 421 is driven in the vertical direction by the boat vertical driving structure 420 provided with the linear actuator, it is possible to drive the support 441 fixed to the substrate support 300 in the vertical direction relative to the support 440 fixed to the partition plate support 310.

The support 440 fixed to the partition plate support 310 and the support 441 fixed to the substrate support 300 are connected by a vacuum bellows 443.

An O-ring 446 for a vacuum seal is installed on an upper surface of the base flange 401 serving as the lid, and as shown in FIG. 1, by driving the vertical driving motor 410 such that the upper surface of the base flange 401 is elevated to a position where it is pressed against the transfer chamber 217, it is possible to maintain an inside of the reaction tube 210 airtight.

Subsequently, the gas supplier will be described in detail with reference to FIGS. 2 and 3.

Figure 2:
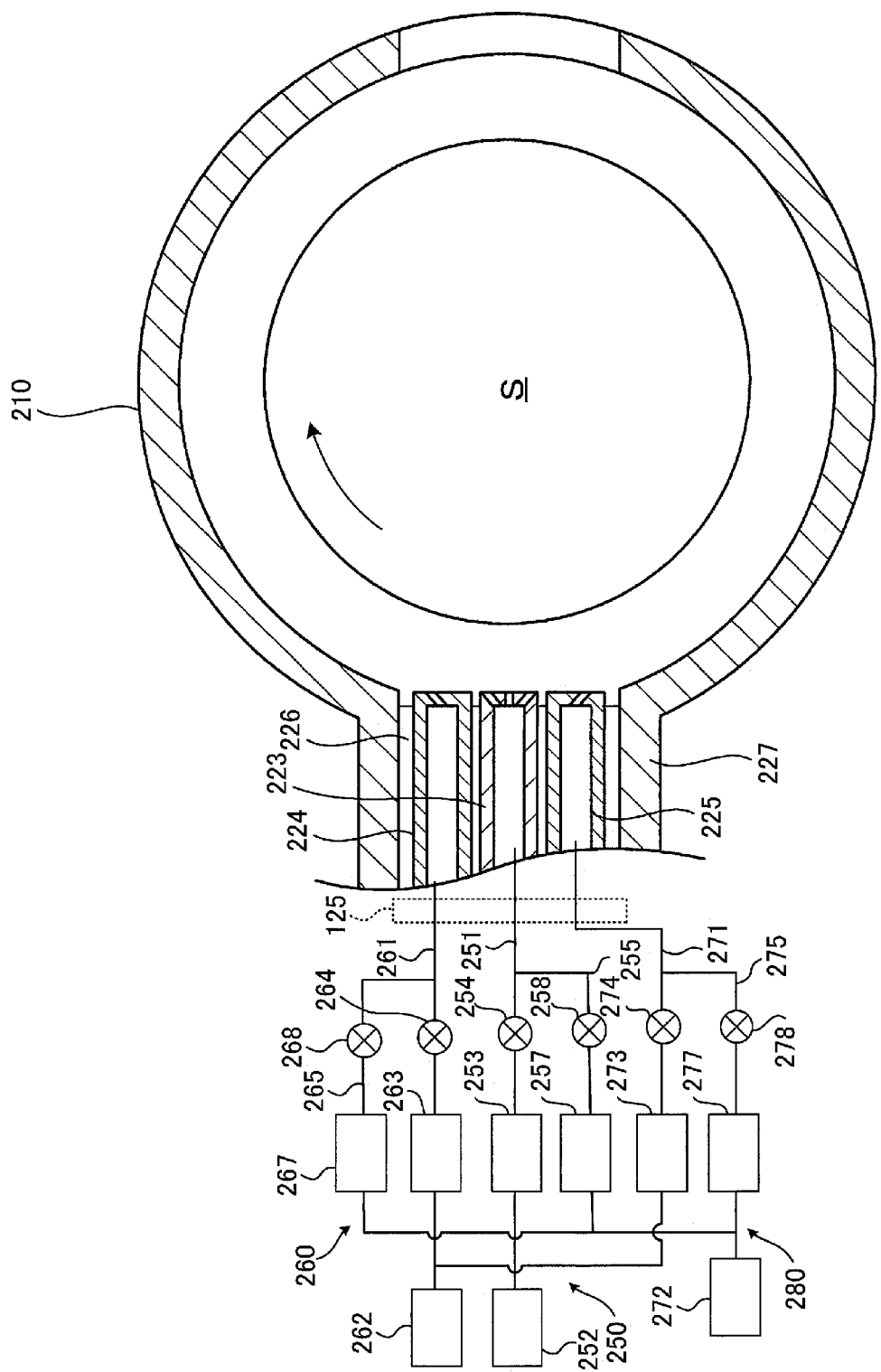
FIG. 2 is a diagram specifically illustrating a horizontal cross-section of a reaction tube and a gas supply structure shown in FIG. 1.

As shown in FIG. 2, the nozzle 223, the nozzle 224 and the nozzle 225 are provided in the housing 227 of the upstream side gas guide 214, more specifically, between the partition plates 226 or between the partition plate 226 and the housing 227. The nozzle 223, the nozzle 224 and the nozzle 225 are provided on an upstream side along the substantially horizontal direction with respect to each substrate S and outside of an outer periphery of each substrate S.

The nozzle 223 is arranged in a central region of an external zone beside an outer periphery of the substrate S. In the present disclosure, "external" of "external zone" means "outside of the substrate S". The nozzles 224 and 225 are arranged in lateral regions of the external zone that are horizontally adjacent to the central region of the external zone. The nozzle 224 is arranged rotationally downstream of the nozzle 223 with reference to the rotational direction of the substrate S. The nozzle 225 is arranged rotationally upstream of the nozzle 223 with reference to the rotational direction of the substrate S. That is, the nozzle 223 is interposed between the nozzle 224 and the nozzle 225. In other words, the nozzles 224 and 225 are arranged respectively adjacent to both lateral sides of the nozzle 223 along the horizontal direction.

Figure 3:
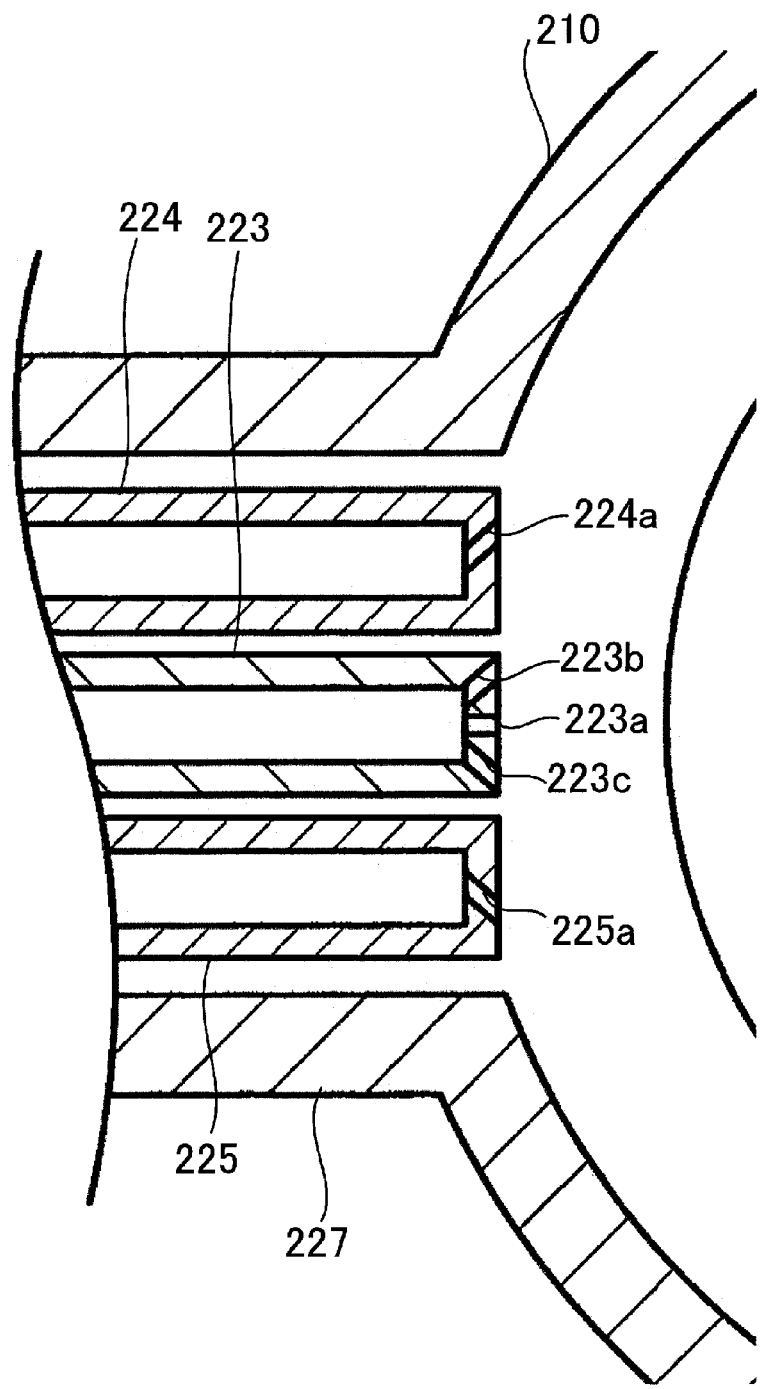
FIG. 3 is a diagram specifically illustrating a gas supply hole of a nozzle shown in FIG. 2.

As shown in FIG. 3, at a front end (tip) of the nozzle 223, there are provided a hole 223a that opens toward the center of the substrate S, a hole 223b that opens toward a rotationally downstream portion of the edge region of the substrate S and a hole 223c that opens toward a rotationally upstream portion of the edge region the substrate S. The hole 223a is configured such that the gas is supplied therethrough toward the center of the substrate S. Further, the hole 223b is tilted obliquely and is located rotationally downstream of the hole 223a with reference to the rotational direction of the substrate S. The hole 223b is configured such that the gas is supplied therethrough toward the rotationally downstream portion of the edge region of the substrate S with reference to the rotational direction of the substrate S. Further, the hole 223c is tilted obliquely and is located rotationally upstream of the hole 223a with reference to the rotational direction of the substrate S. The hole 223c is configured such that the gas is supplied therethrough toward a rotationally upstream portion of the edge region of the substrate S with reference to the rotational direction of the substrate S. That is, the holes 223a, 223b and 223c are provided at the front end of the nozzle 223 such that the gas is supplied in three different directions.

For example, a diameter of the hole 223a is about 6 mm, and is set to be larger than diameters of the holes 223b and 223c arranged on both sides of the hole 223a. The holes 223b and 223c are arranged in line symmetry with each other with respect to the hole 223a and extend along directions toward the edge region of the substrate S.

At a front end (tip) of the nozzle 224 is provided a hole 224a that opens toward the rotationally downstream portion of the edge region of the substrate S with reference to the rotational direction of the substrate S. The hole 224a is tilted obliquely and faces toward the outside. The hole 224a is configured such that the gas is supplied therethrough toward the rotationally downstream portion of the edge region of the substrate S with reference to the rotational direction of the substrate S.

At a front end (tip) of the nozzle 225 is provided a hole 225a that opens toward the rotationally upstream portion of the edge region of the substrate S with reference to the rotational direction. The hole 225a is tilted obliquely and faces toward the outside. The hole 225a is configured such that the gas is supplied therethrough toward the rotationally upstream portion of the edge region of the substrate S with reference to the rotational direction of the substrate S.

The holes 224a and 225a are arranged in line symmetrically with each other with respect to the hole 223a and extend along directions toward the edge region of the substrate S. In addition, the holes 224a and 225a are arranged rotationally further toward the edge region than the holes 223b and 223c. Further, for example, a diameter of each of the holes 224a and 225a is about 2 mm.

The gas supply pipe 251 is connected to the nozzle 223. The gas supply pipe 261 is connected to the nozzle 224. The gas supply pipe 271 is connected to the nozzle 225.

A source gas supply source 252, a mass flow controller (MFC) 253 serving as a flow rate controller (a flow rate control structure) and a valve 254 serving as an opening/closing valve are sequentially installed at the gas supply pipe 251 in this order from an upstream side to a downstream side of the gas supply pipe 251.

Figure 4A:
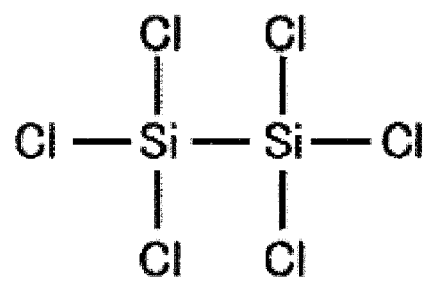
FIGS. 4A through 4C are diagrams schematically illustrating examples of a chemical structural formula of a source gas according to the embodiments of the present disclosure.

The source gas serving as a process gas is supplied from the source gas supply source 252. According to the present embodiments, the source gas refers to a gas to which at least two silicon (Si) atoms are bonded, and for example, refers to a gas containing silicon and chlorine (Cl). For example, the source gas may refer to a gas containing a silicon-silicon (Si—Si) bond such as disilicon hexachloride ($Si_2Cl_6$, hexachlorodisilane, abbreviated as HCDS) gas shown in FIG. 4A. As shown in FIG. 4A, the HCDS gas contains silicon and a chloro group (chloride) in its chemical structural formula (in one molecule). Further, according to the present embodiments, the source gas refers to a gas whose properties include an undecomposed time during which a predetermined decomposition rate is maintained under a predetermined condition and a decomposition time during which a decomposition rate higher than the predetermined decomposition rate is maintained under other predetermined condition. Further, the term "undecomposed" refers to states including not only a state in which the gas is not decomposed at all but also a state in which the gas is decomposed to some extent. That is, the term "undecomposed" may refer to a state in which the gas in an "undecomposed" state is dominant. Since the term "undecomposed" is in such a state, the term "undecomposed" may also be referred to as a "low decomposition" instead of "undecomposed". Therefore, the undecomposed time may also be referred to as a "low decomposition time".

The Si—Si bond contains enough energy to be decomposed by a collision with a wall constituting a concave structure (or a recess) of the substrate S, which will be described later, in the reaction tube 210. According to the present embodiments, the term "decomposed" means that the Si—Si bond is broken. That is, the Si—Si bond is broken by the collision with the wall.

A gas supply pipe 255 is connected to a downstream side of the valve 254 in the gas supply pipe 251. An inert gas supply source 272, an MFC 257 and a valve 258 serving as an opening/closing valve are sequentially installed at the gas supply pipe 255 in this order from an upstream side to a downstream side of the gas supply pipe 255. An inert gas (for example, nitrogen ($N_2$) gas) is supplied from the inert gas supply source 272.

A first gas supplier (which is a first gas supply structure) 250 is constituted mainly by the gas supply pipe 251, the MFC 253, the valve 254, the gas supply pipe 255, the MFC 257, the valve 258 and the nozzle 223.

The inert gas supplied mainly through the gas supply pipe 255 acts as a carrier gas for transferring the source gas when supplying the source gas, and acts as a purge gas for purging the gas remaining in the reaction tube 210 when performing a purge process.

Figure 4B:
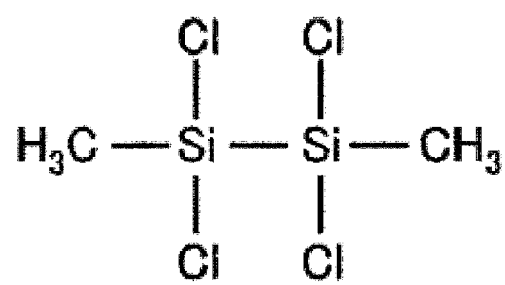
Figure 4C:
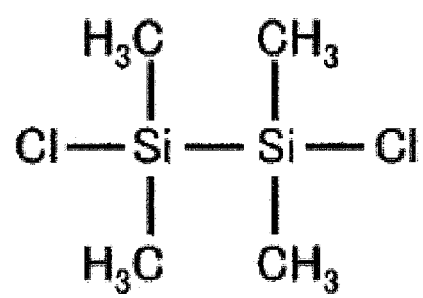

While the present embodiments will be described by way of an example in which the HCDS gas is used as the source gas, the source gas is not limited thereto. For example, a gas containing silicon and a Si—Si bond may be used as the source gas. That is, for example, a gas such as 1,1,2,2-tetrachloro-1,2-dimethyldisilane (($CH_3)_2Si_2Cl_4$, abbreviated as TCDMDS) and 1,2-dichloro-1,1,2,2-tetramethyldisilane (($CH_3)_4Si_2Cl_2$, abbreviated as DCTMDS) may be used as the source gas. As shown in FIG. 4B, the TCDMDS contains a Si—Si bond, and further contains a chloro group and an alkylene group. Further, as shown in FIG. 4C, the DCTMDS contains a Si—Si bond, and further contains a chloro group and an alkylene group.

As shown in FIG. 2, a reactive gas supply source 262, a mass flow controller (MFC) 263 serving as a flow rate controller (a flow rate control structure) and a valve 264 serving as an opening/closing valve are sequentially installed at the gas supply pipe 261 in this order from an upstream side to a downstream side of the gas supply pipe 261.

The reactive gas reacting with the source gas is supplied from the reactive gas supply source 262. According to the present embodiments, for example, the reactive gas refers to a gas containing one among oxygen (O), nitrogen (N) and carbon (C). According to the present embodiments, for example, the reactive gas is a nitrogen-containing gas, and is a hydrogen nitride-based gas containing a nitrogen-hydrogen (N—H) bond such as ammonia ($NH_3$), diazene ($N_2H_2$) gas, hydrazine ($N_2H_4$) gas and $N_3H_8$ gas.

A gas supply pipe 265 is connected to a downstream side of the valve 264 in the gas supply pipe 261. The inert gas supply source 272, an MFC 267 and a valve 268 serving as an opening/closing valve are sequentially installed at the gas supply pipe 265 in this order from an upstream side to a downstream side of the gas supply pipe 265.

A second gas supplier (which is a second gas supply structure) 260 is constituted mainly by the gas supply pipe 261, the MFC 263, the valve 264, the gas supply pipe 265, the MFC 267, the valve 268 and the nozzle 224.

The inert gas supplied mainly through the gas supply pipe 265 acts as the carrier gas for transferring the source gas when supplying the source gas, and acts as the purge gas for purging the gas remaining in the reaction tube 210 when performing the purge process.

As shown in FIG. 2, the reactive gas supply source 262, a mass flow controller (MFC) 273 serving as a flow rate controller (a flow rate control structure) and a valve 274 serving as an opening/closing valve are sequentially installed at the gas supply pipe 271 in this order from an upstream side to a downstream side of the gas supply pipe 271.

A gas supply pipe 275 is connected to a downstream side of the valve 274 in the gas supply pipe 271. The inert gas supply source 272, an MFC 277 and a valve 278 serving as an opening/closing valve are sequentially installed at the gas supply pipe 275 in this order from an upstream side to a downstream side of the gas supply pipe 275.

A third gas supplier (which is a third gas supply structure) 280 is constituted mainly by the gas supply pipe 271, the MFC 273, the valve 274, the gas supply pipe 275, the MFC 277, the valve 278 and the nozzle 225.

The inert gas supplied mainly through the gas supply pipe 275 acts as the carrier gas for transferring the source gas when supplying the source gas, and acts as the purge gas for purging the gas remaining in the reaction tube 210 when performing the purge process.

The same reactive gas or the inert gas as that supplied through the second gas supplier 260 is supplied to the substrate S through the third gas supplier 280. Therefore, the third gas supplier 280 may also be referred to as the second gas supplier 260 (or a part of the second gas supplier 260).

Subsequently, an exhauster (which is an exhaust structure or an exhaust system) 290 will be described with reference to FIG. 1. The exhauster 290 configured to exhaust an inner atmosphere of the reaction tube 210 includes an exhaust pipe 291 that communicates with the reaction tube 210, and is connected to the housing 241 via the gas exhaust pipe connection structure 242.

As shown in FIG. 1, a vacuum pump 294 serving as a vacuum exhaust apparatus is connected to the exhaust pipe 291 via a valve 292 serving as an opening/closing valve, an APC (Automatic Pressure Controller) valve 293 serving as a pressure regulator (which is a pressure adjusting structure). Thereby, the reaction tube 210 is vacuum-exhausted such that an inner pressure of the reaction tube 210 reaches and is maintained at a predetermined pressure (vacuum degree). The exhaust pipe 291, the valve 292 and the APC valve 293 may also be collectively referred to as the exhauster 290. The exhauster 290 may also be referred to as a process chamber exhauster. The exhauster 290 may further include the vacuum pump 294.

Subsequently, a controller 600 serving as a control structure (control apparatus) will be described with reference to FIG. 5. The substrate processing apparatus 10 includes the controller 600 configured to control operations of components constituting the substrate processing apparatus 10.

Figure 5:
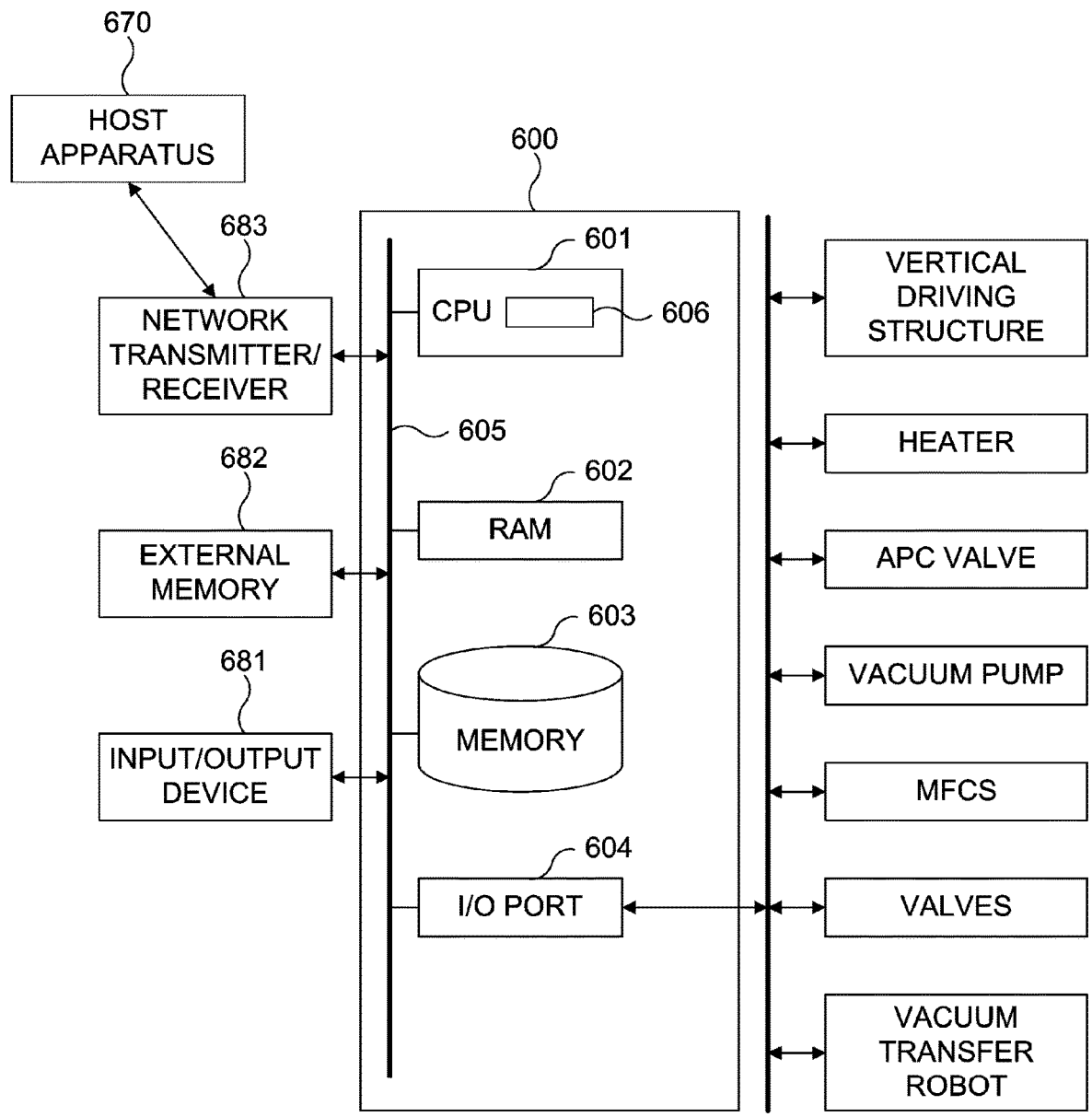
FIG. 5 is a block diagram schematically illustrating a configuration of a controller and related components of the substrate processing apparatus according to the embodiments of the present disclosure.
Figure 6:
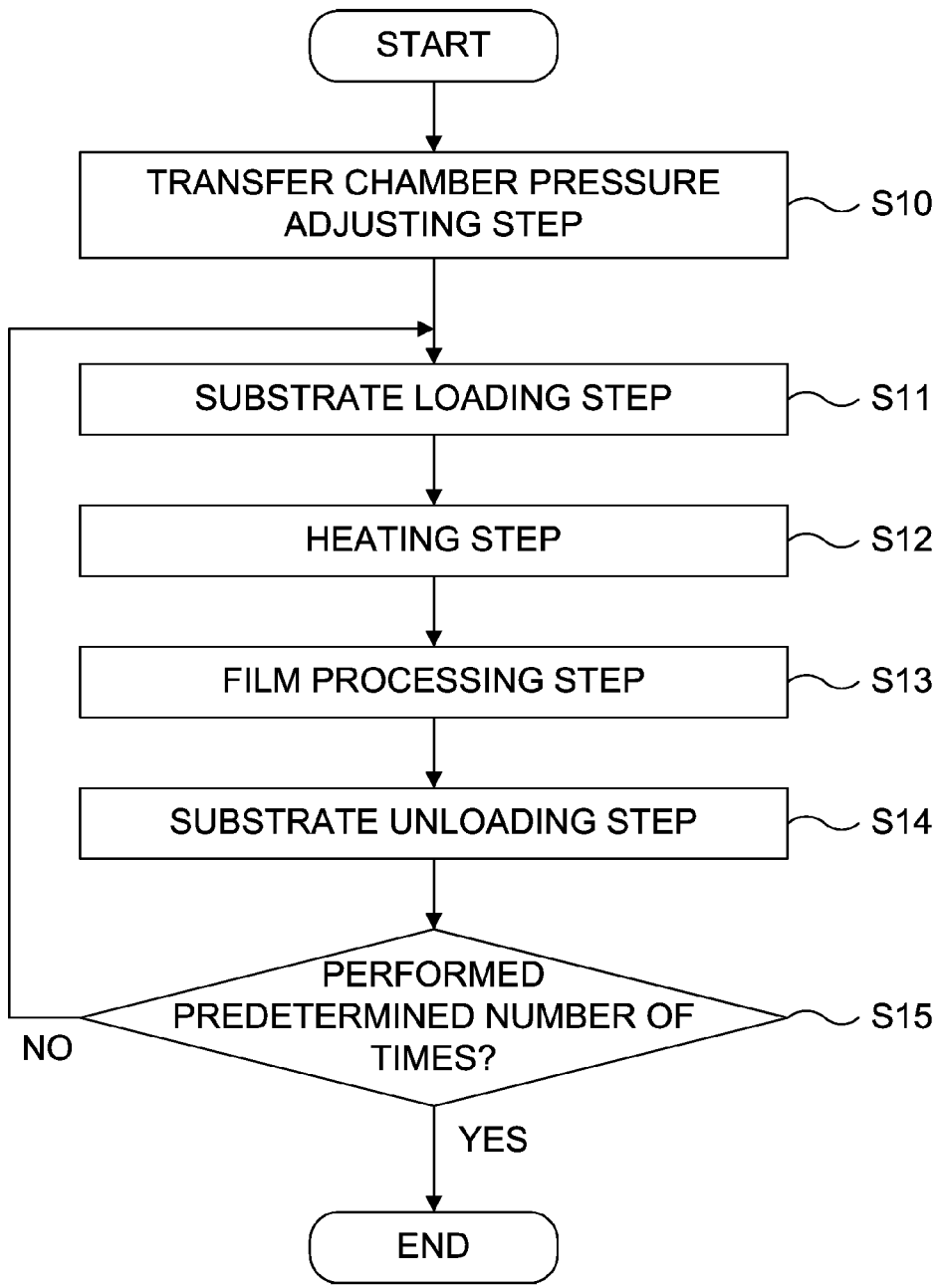
FIG. 6 is a diagram schematically illustrating a substrate processing sequence according to the embodiments of the present disclosure.
Figure 7:
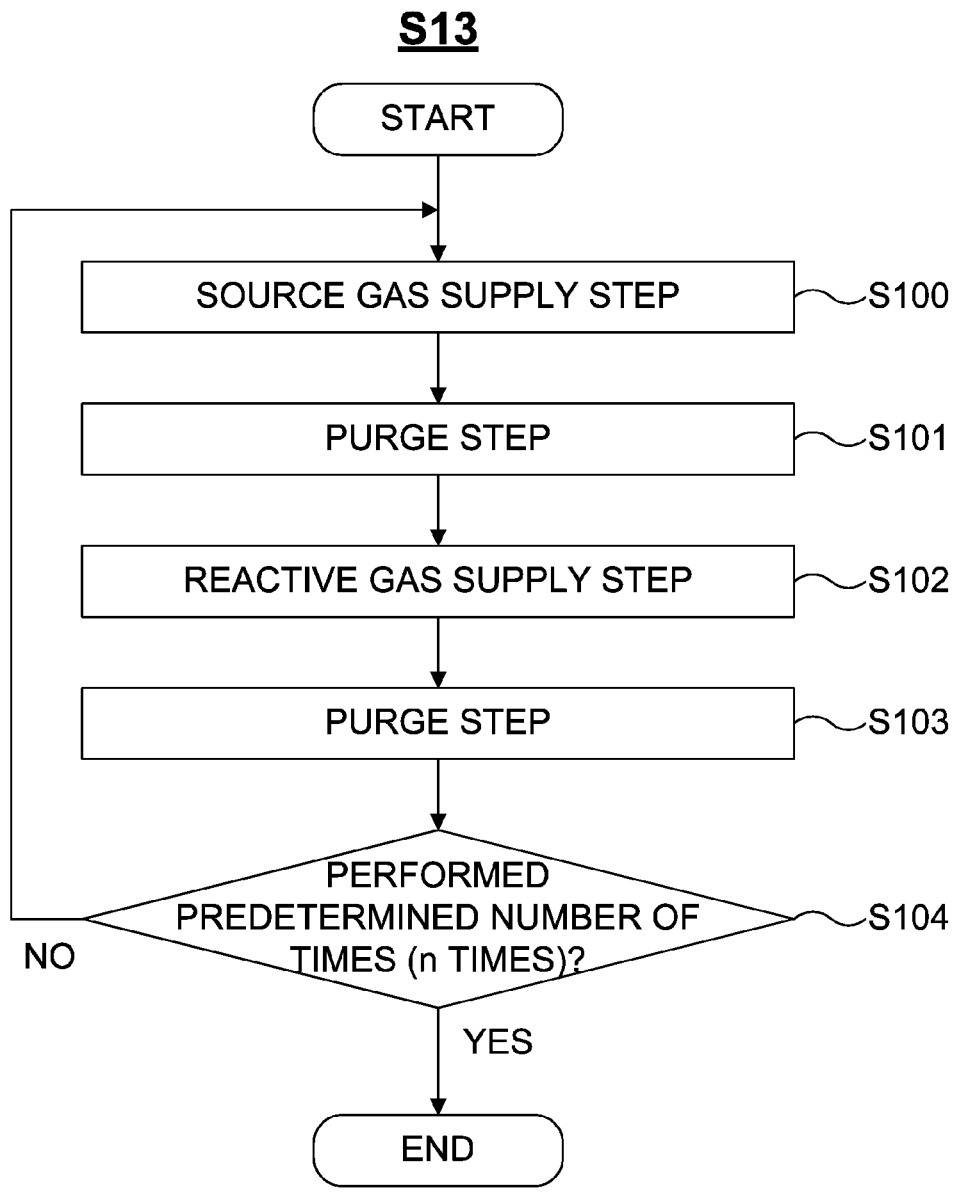
FIG. 7 is a flow chart specifically illustrating a film processing step shown in FIG. 6.

FIG. 5 is a diagram schematically illustrating a configuration of the controller 600. The controller 600 may be embodied by a computer including a CPU (Central Processing Unit) 601, a RAM (Random Access Memory) 602, a memory 603 serving as a memory structure and an I/O port (input/output port) 604. The RAM 602, the memory 603 and the I/O port 604 may exchange data with the CPU 601 via an internal bus 605. The transmission/reception of the data in the substrate processing apparatus 10 may be performed by an instruction from a transmission/reception instruction controller 606, which is also one of functions of the CPU 601.

A network transmitter/receiver 683 connected to a host apparatus 670 via a network is provided at the controller 600. For example, the network transmitter/receiver 683 is capable of receiving data such as information regarding a processing history and a processing schedule of the substrate S stored in a pod from the host apparatus 670.

For example, the memory 603 may be embodied by a component such as a flash memory and a HDD (Hard Disk Drive). For example, a control program for controlling the operations of the substrate processing apparatus 10 or a process recipe in which information such as sequences and conditions of a substrate processing is stored may be readably stored in the memory 603.

The process recipe is obtained by combining steps of the substrate processing described later and, acts as a program that is executed by the controller 600 to obtain a predetermined result by performing the steps of the substrate processing described later. Hereinafter, the process recipe and the control program may be collectively or individually referred to simply as a "program". Thus, in the present specification, the term "program" may refer to the process recipe alone, may refer to the control program alone, or may refer to both of the process recipe and the control program. The RAM 602 serves as a memory area (work area) in which the program or the data read by the CPU 601 are temporarily stored.

The I/O port 604 is electrically connected to the components of the substrate processing apparatus 10 described above.

The CPU 601 is configured to read and execute the control program from the memory 603, and is configured to read the process recipe from the memory 603 in accordance with an instruction such as an operation command inputted from an input/output device 681. The CPU 601 is configured to be capable of controlling the substrate processing apparatus 10 in accordance with contents of the process recipe read from the input/output device 681.

The CPU 601 includes the transmission/reception instruction controller 606. For example, the controller 600 according to the present embodiments may be embodied by preparing an external memory 682 (for example, a magnetic disk such as a hard disk, an optical disk such as a DVD, a magneto-optical disk such as an MO, a semiconductor memory such as a USB memory) storing the program described above and by installing the program onto the computer by using the external memory 682. Further, a method of providing the program to the computer is not limited to the external memory 682. For example, the program may be directly provided to the computer by a communication interface such as the Internet and a dedicated line instead of the external memory 682. Further, the memory 603 and the external memory 682 may be embodied by a non-transitory computer-readable recording medium. Hereinafter, the memory 603 and the external memory 682 may be collectively or individually referred to as a "recording medium". In the present specification, the term "recording medium" may refer to the memory 603 alone, may refer to the external memory 682 alone, or may refer to both of the memory 603 and the external memory 682.

Hereinafter, as a part of a process of manufacturing a semiconductor device, the substrate processing will be described by way of an example in which a film-forming process of forming a film on the substrate S is performed by using the substrate processing apparatus 10 described above. In the following description, the controller 600 controls the operations of the components constituting the substrate processing apparatus 10.

For example, the film-forming process of forming the film on the substrate S by alternately supplying the source gas and the reactive gas will be described with reference to FIGS. 6 through 13. A groove serving as the concave structure is formed on the surface of the substrate S.

<S10>

A transfer chamber pressure adjusting step S10 will be described. In the step S10, an inner pressure of the transfer chamber 217 is set to the same level as that of a vacuum transfer chamber (not shown) provided adjacent to the transfer chamber 217.

<S11>

Subsequently, a substrate loading step S11 will be described. When the inner pressure of the transfer chamber 217 reaches a vacuum level, a transfer of the substrate S is started. When the substrate S reaches the vacuum transfer chamber, a gate valve (not shown) is opened. Then, the substrate S is loaded (transferred) into the transfer chamber 217 by the vacuum transfer robot.

When the substrate S is loaded, the substrate support 300 stands by in the transfer chamber 217, and the substrate S is transferred to the substrate support 300. When a predetermined number of substrates S are transferred to the substrate support 300, the vacuum transfer robot is retracted, and the substrate support 300 is elevated by the vertical driving structure 400 to move the substrates S into a process chamber inside the reaction tube 210.

When moving the substrate S to the reaction tube 210, the surface of the substrate S is positioned so as to be aligned with heights of the partition plate 226 and the partition plate 232.

<S12>

Subsequently, a heating step S12 will be described. When the substrate S is loaded into the process chamber inside the reaction tube 210, the inner pressure of the reaction tube 210 is controlled (or adjusted) to be a predetermined pressure and a surface temperature of the substrate S is controlled to be a predetermined temperature. For example, a temperature of the heater 211 is controlled such that a temperature (that is, the surface temperature) of the substrate S reaches and is maintained at a temperature within a range of 100° C. or higher and 1,500° C. or lower, preferably 200° C. or higher and 1,000° C. or lower, and more preferably 400° C. or higher and 800° C. or lower. Further, for example, it is conceivable that the inner pressure of the reaction tube 210 reaches and is maintained at a pressure within a range from 5 Pa to 100 kPa. That is, the substrates S are processed while being stacked on the substrate support 300.

<S13>

Subsequently, a film processing step S13 will be described. In the film processing step S13, in accordance with the process recipe, the following steps (that is, a step S100, a step S101, a step S102, a step S103 and a step S104) are performed on the substrate S provided with the groove serving as the concave structure on the surface thereof.

<Source Gas Supply Step S100>

Figure 8:
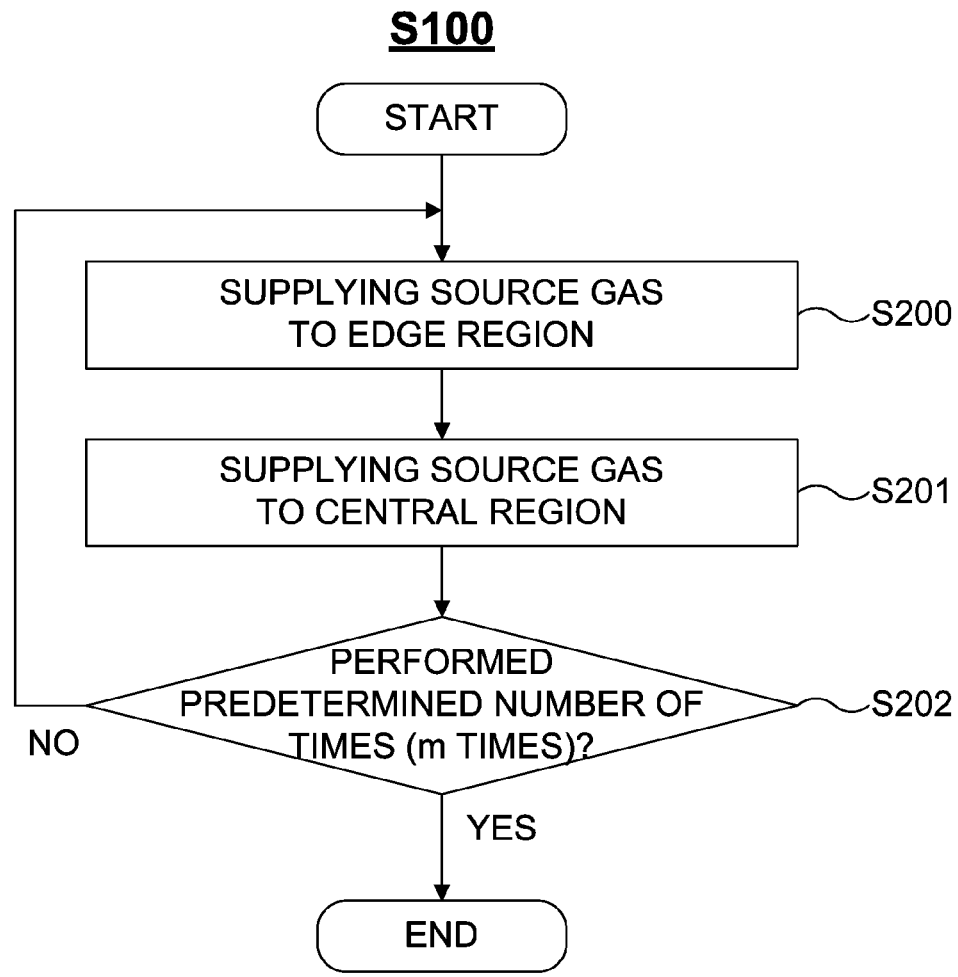
FIG. 8 is a flow chart specifically illustrating a source gas supply step shown in FIG. 7.

First, the source gas is supplied into the reaction tube 210. In the source gas supply step S100, as shown in FIG. 8, a step of supplying the source gas to the edge region (which is a step S200) and a step of supplying the source gas to a central region (which is a step S201) are performed a predetermined number of times (that is, a step S202 is performed). The same source gas is supplied in both steps (that is, the step S200 and the step S201). However, the present embodiments are not limited thereto. For example, a first source gas may be used in the step S200 and a second source gas may be used in the step S201 even with different constituents as long as a primary constituent (or a main constituent: for example, silicon constituent) contributing to a film-forming reaction is the same.

In the source gas supply step S100, according to a configuration in which the gas is supplied through the lateral direction of the substrate S and exhausted along the lateral direction as in the substrate processing apparatus 10 described above, as compared with a configuration in which the gas is supplied along a lower direction of the substrate S and exhausted through a lower portion of the substrate S, it is possible to supply the source gas in the undecomposed state.

However, even in the configuration in which the gas is supplied along the lateral direction of the substrate S and exhausted along the lateral direction as in the substrate processing apparatus 10 described above, when a decomposition-based gas such as the HCDS gas is used as the source gas, depending on a supply method of the gas, a decomposition state of the source gas may differ between the central region of the substrate S and the edge region of the substrate S (which is an outer periphery of the substrate S). Thereby, a step coverage may differ between the central region of the substrate S and the edge region of the substrate S. In order to improve the step coverage, for example, when the HCDS gas is used as the source gas, a certain amount of exposure to HCDS in the undecomposed state and a certain amount of exposure to $SiCl_2$ in a decomposed state should be applied to the entire region of the substrate.

Figure 9A:
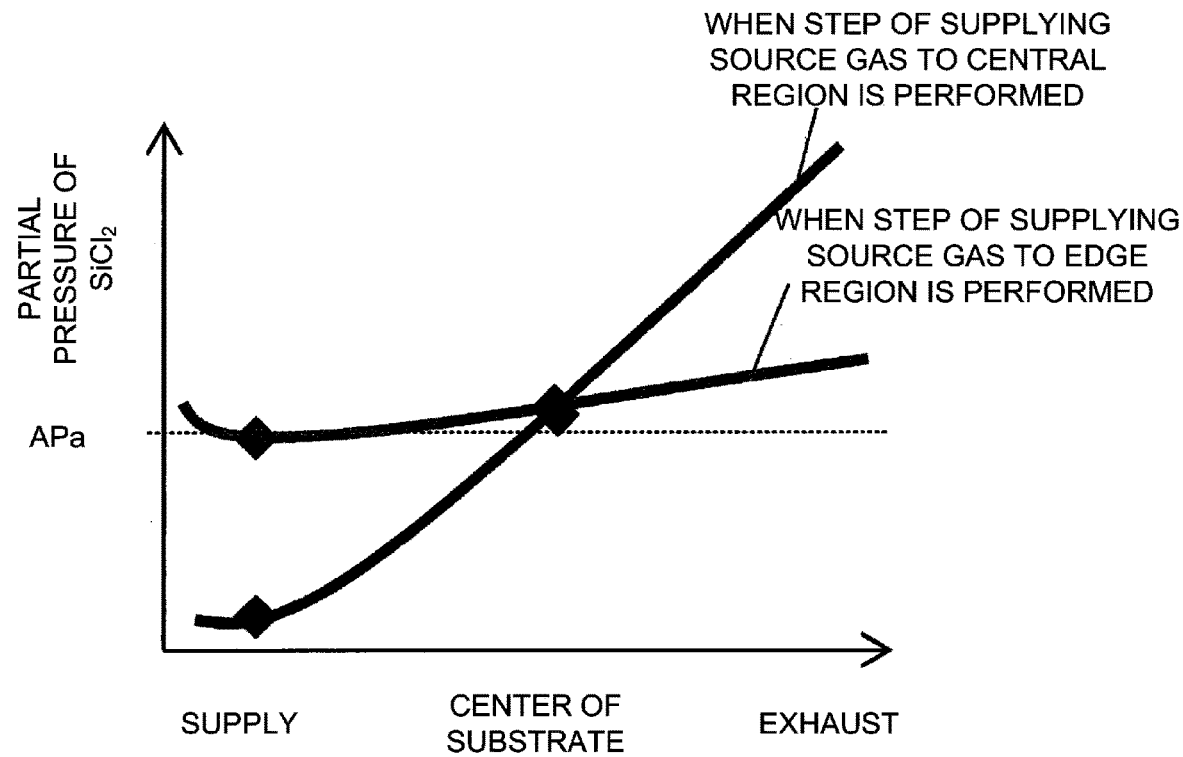
FIG. 9A is a diagram schematically illustrating a partial pressure of $SiCl_2$ along a flow path from supply to exhaust when a step of supplying the source gas to an edge region is performed and when a step of supplying the source gas to a central region is performed.
Figure 9B:
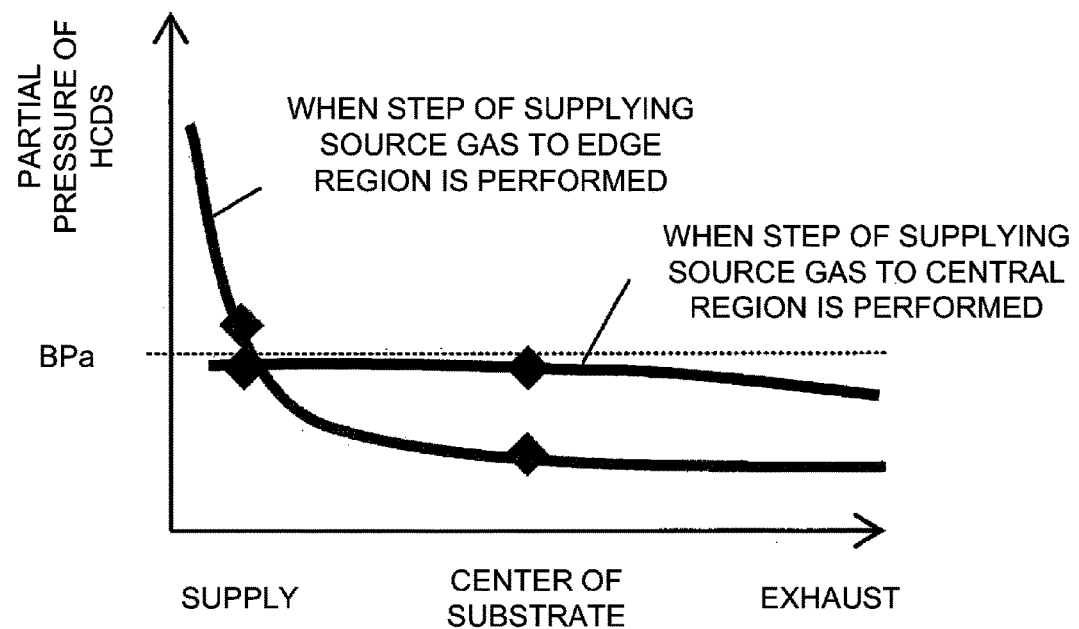
FIG. 9B is a diagram schematically illustrating a partial pressure of HCDS along a flow path from supply to exhaust when the step of supplying the source gas to the edge region is performed and when the step of supplying the source gas to the central region is performed.

FIG. 9A is a diagram schematically illustrating a partial pressure of the $SiCl_2$ along a flow path from supply to exhaust (that is, from a gas supply side to an exhaust side) when the step of supplying the source gas to the edge region is performed and when the step of supplying the source gas to the central region is performed. FIG. 9B is a diagram schematically illustrating a partial pressure of the HCDS along a flow path from supply to exhaust when the step of supplying the source gas to the edge region is performed and when the step of supplying the source gas to the central region is performed.

As shown in FIGS. 9A and 9B, when the step of supplying the source gas to the edge region is performed, which will be described later, it is possible to maintain the partial pressure of the $SiCl_2$ at about "A" Pa from the gas supply side to the exhaust side. On the other hand, when the step of supplying the source gas to the edge region is performed, the partial pressure of the HCDS on the exhaust side becomes lower than that of the HCDS on the gas supply side. Further, when the step of supplying the source gas to the central region is performed, which will be described later, it is possible to maintain the partial pressure of the HCDS at about "B" Pa from the gas supply side to the exhaust side (B is greater than A). On the other hand, when the step of supplying the source gas to the central region is performed, the partial pressure of the $SiCl_2$ on the exhaust side becomes higher than that of the $SiCl_2$ on the gas supply side. That is, the partial pressure of the HCDS is insufficient in the central region of the substrate S when the step of supplying the source gas to the edge region is performed alone, and the partial pressure of the $SiCl_2$ is insufficient in the edge region of the substrate S when the step of supplying the source gas to the central region is performed alone.

The disclosers confirmed that, by continuously performing the step of supplying the source gas to the edge region and the step of supplying the source gas to the central region as described later, it is possible to set the amount of exposure to the HCDS in the undecomposed state and the amount of exposure to the $SiCl_2$ in the decomposed state to be constant over the entire region of such findings found by the disclosers.

<Supplying Source Gas to Edge Region: Step S200>

The valve 254 is opened so as to supply the source gas into the gas supply pipe 251. A flow rate of the source gas is adjusted by the MFC 253, and the source gas whose flow rate is adjusted is supplied into the reaction tube 210 via the distribution structure 125, the nozzle 223, the holes 223a, 223b and 223c. In parallel with supplying the source gas, the valves 268 and 278 are opened so as to supply the inert gas such as the $N_2$ gas into the gas supply pipes 261 and 271. A flow rate of the inert gas is adjusted by the MFCs 267 and 277, and the inert gas whose flow rate is adjusted is supplied into the reaction tube 210 via the distribution structure 125, the nozzles 224 and 225, and the holes 224a and 225a. Then, the source gas and the inert gas are exhausted through a space on the substrate S, the downstream side gas guide 215, the gas exhaust structure 213 and the exhaust pipe 291. That is, in the present step, the source gas and the inert gas are supplied into the reaction tube 210 as the process gas. In the present specification, the source gas used in the step S200 may also be referred to as a "first process gas". The first process gas may further include the inert gas. That is, the first process gas may refer to the source gas used in the step S200 alone, or may refer to both of the source gas used in the step S200 and the inert gas.

Figure 10:
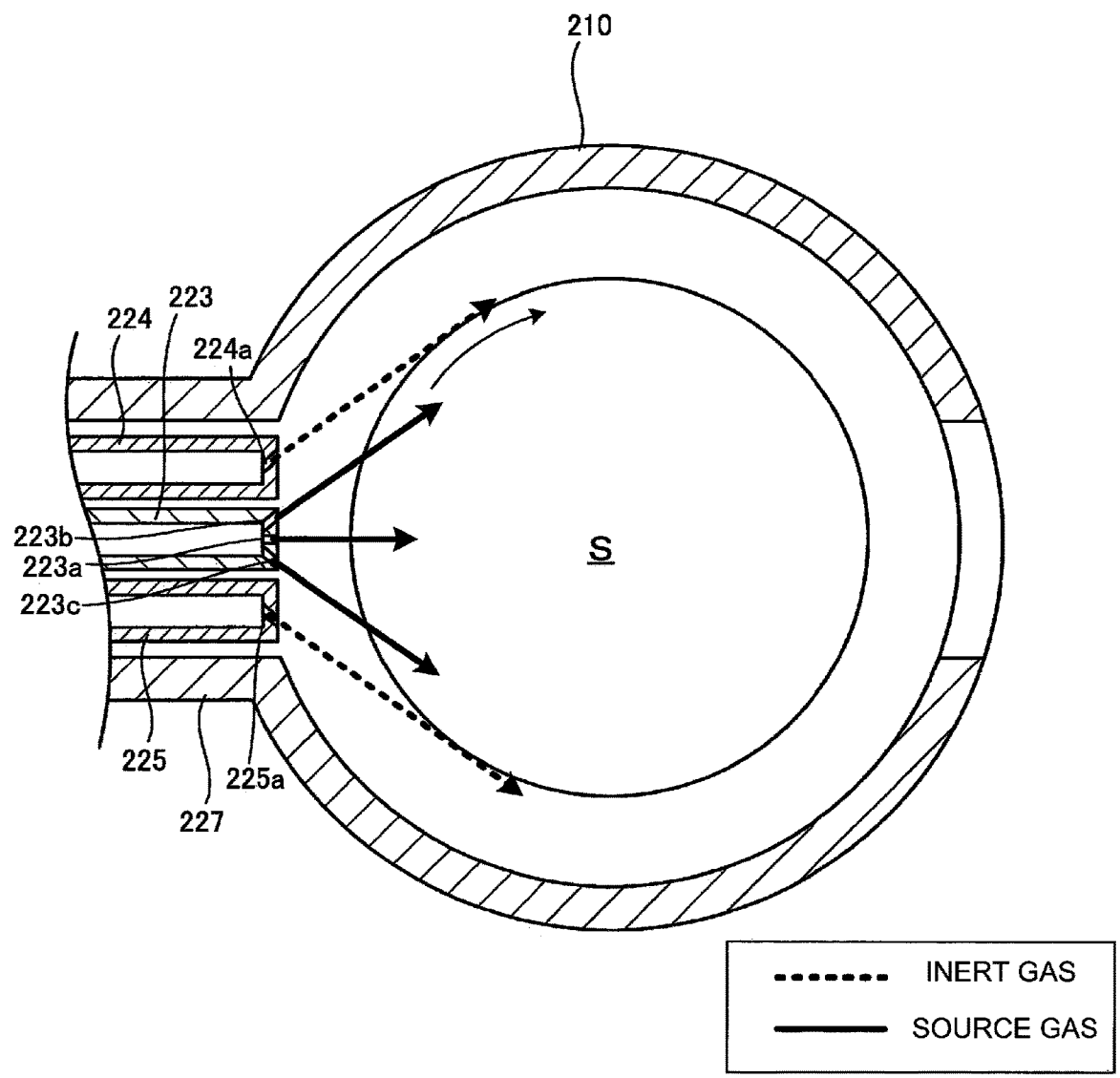
FIG. 10 is a diagram schematically illustrating the step of supplying the source gas to the edge region shown in FIG. 8.

As shown in FIG. 10, in parallel with supplying the source gas toward the central region of the substrate S and both edge regions of the substrate S through the nozzle 223 arranged in the central region of the external zone beside the peripheral edge of the substrate S, the inert gas is supplied toward both edge regions of the substrate S through the nozzles 224 and 225 arranged in the lateral regions of the external zone horizontally adjacent to the central region of the external zone.

In other words, in parallel with supplying the source gas toward the edge region of the substrate S through the nozzle 223 arranged in the central region of the external zone, the inert gas is supplied toward the edge region of the substrate S through the nozzles 224 and 225 arranged in the lateral regions of the external zone. That is, in parallel with supplying the inert gas toward the edge region of the substrate S, the source gas is supplied. In the step S200, the inert gas reaches the edge region of the substrate S more than the source gas.

In the step S200, the flow rate of the inert gas adjusted by the MFCs 267 and 277 (also referred to as a "second flow rate") is set to be greater than the flow rate of the source gas adjusted by the MFC 253 (also referred to as a "first flow rate"). Further, the flow rate of the inert gas adjusted by the MFC 267 and the flow rate of the inert gas adjusted by the MFC 277 are set to be equal. That is, a supply amount of the inert gas supplied through the nozzle 224 and a supply amount of the inert gas supplied through the nozzle 225 are set to be equal, and the inert gas is supplied to both edge regions of the substrate S at the same flow rate via the holes 224a and 225a, respectively.

That is, in parallel with supplying the source gas at the first flow rate toward the central region of the substrate S and the edge region of the substrate S through the holes 223a, 223b and 223c, the inert gas is supplied at the second flow rate greater than the first flow rate toward the edge region of the substrate S via the holes 224a and 225a. Therefore, the source gas is supplied such that a transfer velocity (or a flow velocity) of the source gas toward the edge region of the substrate S is faster than the transfer velocity (or the flow velocity) of the source gas supplied toward the central region of the substrate S. Thereby, it is possible to impart directivity to the source gas. Further, since the source gas toward the edge region of the substrate S is attracted by the inert gas supplied toward the edge region of the substrate S, the transfer velocity of the source gas toward the edge region of the substrate S becomes faster than the transfer velocity of the source gas toward the central region of the substrate S. That is, in the step of supplying the source gas to the edge region (which is the step S200), by supplying the inert gas serving as the carrier gas to the edge region of the substrate S at a flow rate higher than that of the source gas, it is possible to set the source gas to reach the edge region of the substrate S during the non-decomposition time of the source gas.

In the step S200, the source gas is supplied in the horizontal direction from the central region of the external zone toward the edge region of the substrate S from the nozzle 223 communicating with the process chamber. As the source gas, a gas to which at least two silicon atoms are bonded (for example, the $Si_2Cl_6$ gas (hereinafter, also referred to as the "HCDS gas") containing silicon and chlorine (Cl)) may be used. That is, the source gas in the undecomposed state is supplied in the horizontal direction from the central region of the external region to a surface of the edge region of the substrate S. As a result, the source gas is supplied to the edge region of the substrate S in the undecomposed state, and collides with a wall of the groove such that the source gas is decomposed into a precursor. Then, the decomposed precursor adheres to an inner wall of the wall constituting the groove.

<Supplying Source Gas to Central Region: Step S201>

Then, after a predetermined time has elapsed, the valve 258 is opened with the valve 254 open, a supply of the inert gas serving as the carrier gas of the source gas into the gas supply pipe 251 is started while supplying the source gas continuously. The flow rate of the inert gas serving as the carrier gas is adjusted to a third flow rate by the MFC 257. Then, the inert gas whose flow rate is adjusted is merged with the source gas in the gas supply pipe 251, and is supplied into the reaction tube 210 through the distribution structure 125, the nozzle 223 and the holes 223a, 223b and 223c. That is, in parallel with supplying the source gas through the nozzle 223 toward the central region of the substrate S and the edge region of the substrate S, the inert gas is supplied through the nozzle 223 toward the central region of the substrate S and the edge region of the substrate S at the third flow rate. That is, in the present step, the source gas and the inert gas are supplied into the reaction tube 210 as the process gas. In the present specification, the source gas used in the step S201 may also be referred to as the "second process gas". The second process gas may further include the inert gas. That is, the second process gas may refer to the source gas used in the step S201 alone, or may refer to both of the source gas used in the step S201 and the inert gas.

In the step S201, the flow rate of the inert gas is adjusted by the MFCs 267 and 277. Then, a small amount of the inert gas that does not affect the gas supplied through the nozzles 223 is supplied through the nozzles 224 and 225 toward the edge region of the substrate S. In the step S201, the supply amount of the inert gas supplied through the nozzle 224 and the supply amount of the inert gas supplied through the nozzle 225 are set to be equal. Then, the source gas and the inert gas are exhausted through the space on the substrate S, the downstream side gas guide 215, the gas exhaust structure 213 and the exhaust pipe 291. Further, when the source gas and the inert gas are exhausted, the valves 268 and 278 may be closed to stop the supply of the inert gas supplied toward the edge region of the substrate S.

Figure 11:
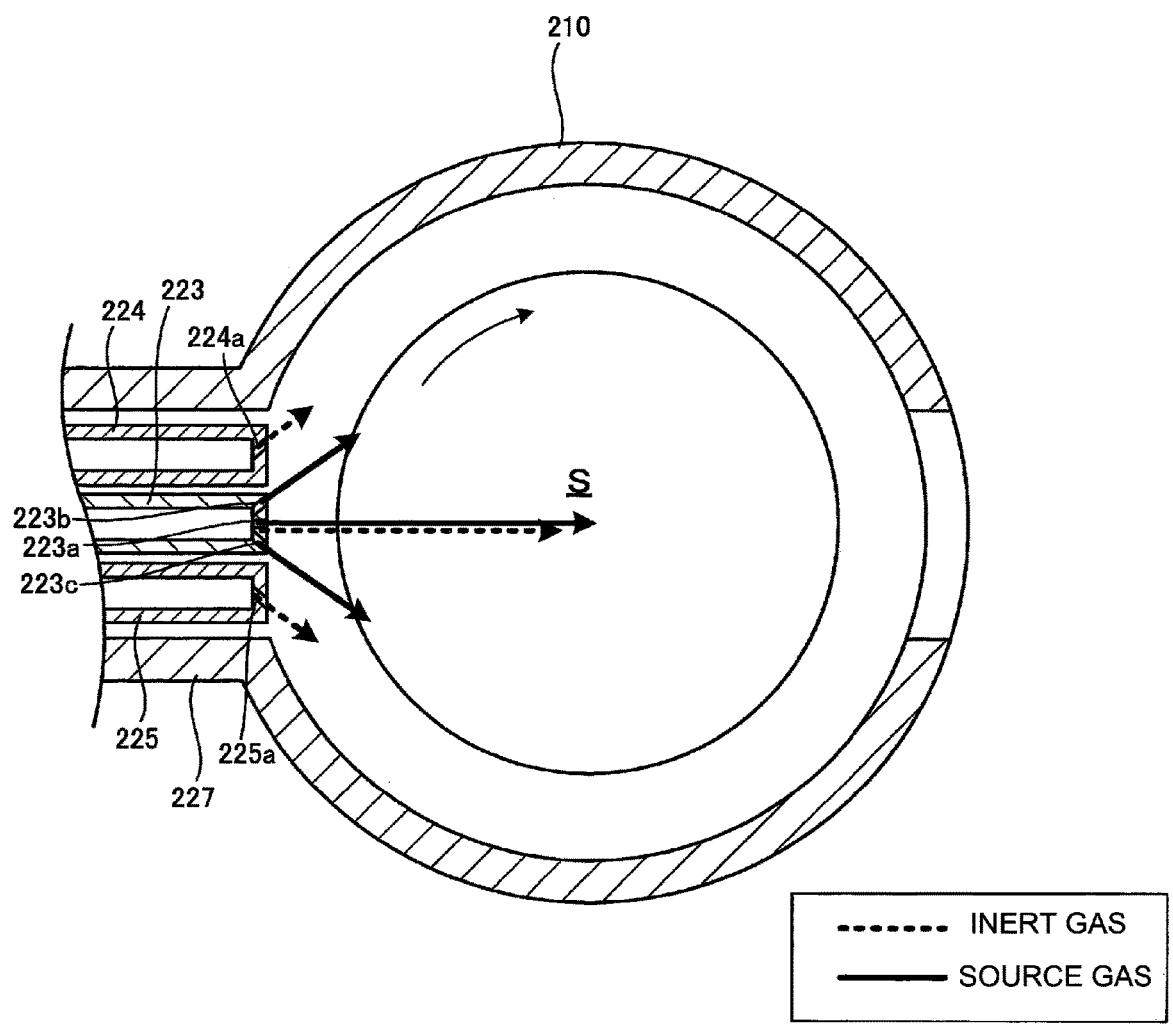
FIG. 11 is a diagram schematically illustrating the step of supplying the source gas to the central region shown in FIG. 8.

As shown in FIG. 11, the source gas is supplied toward the central region of the substrate S and both edge regions of the substrate S through the nozzle 223. In parallel with supplying the source gas toward the central region of the substrate S and the edge region of the substrate S from the central region of the external zone, the inert gas is supplied toward the central region of the substrate S and the edge region of the substrate S from the central region of the external zone.

In other words, in parallel with supplying the source gas toward the central region of the substrate S and both edge regions of the substrate S through the nozzle 223 arranged in the central region of the external zone, the inert gas is supplied toward the central region of the substrate S and both edge regions of the substrate S through the nozzle 223 arranged in the central region of the external zone. That is, in parallel with supplying the inert gas toward the central region of the substrate S and the edge region of the substrate S, the source gas is supplied.

According to the present embodiments, since the diameter of each of the holes 223b and 223c is set to be smaller than the diameter of the hole 223a as described above, in parallel with supplying the source gas mainly toward the central region of the substrate S through the nozzle 223 arranged in the central region of the external zone, the inert gas is supplied toward the central region of the substrate S at the third flow rate through the nozzle 223 arranged in the central region of the external zone. Further, as described above, a small amount of the inert gas that does not affect the gas supplied through the nozzles 223 is supplied through the nozzles 224 and 225 toward both edge regions of the substrate S.

Thereby, the source gas is supplied such that the transfer velocity (or the flow velocity) of the source gas toward the central region of the substrate S is faster than the transfer velocity (or the flow velocity) of the source gas toward the edge region of the substrate S. That is, the source gas is supplied toward the central region of the substrate S without being attracted by the inert gas supplied toward the edge region of the substrate S, and the transfer velocity of the source gas toward the central region of the substrate S becomes faster than the transfer velocity of the source gas toward the edge region of the substrate S. That is, in the step of supplying the source gas to the central region (which is the step S201), by supplying the inert gas serving as the carrier gas to the central region of the substrate S together with the source gas, it is possible to set the source gas to reach the central region of the substrate S during the undecomposed time of the source gas.

In the step S201, the source gas is supplied in the horizontal direction from the central region of the external zone mainly toward the central region of the substrate S through the nozzle 223 communicating with the process chamber. That is, as the source gas in the present step, the same source gas as in the step of supplying the source gas to the edge region (that is, the step S200) may be used. Further, the source gas in the undecomposed state is supplied in the horizontal direction from the central region of the external zone to a surface of the central region of the substrate S. As a result, the source gas is supplied to the central region of the substrate S in the undecomposed state, and collides with the wall constituting the groove such that the source gas is decomposed into the precursor. Then, the decomposed precursor adheres to the inner wall of the wall constituting the groove.

<Performing Predetermined Number of Times: Step S202>

A cycle in which the step S200 and the step S201 described above are sequentially performed in this order is performed one or more times (that is, a predetermined number of times (m times)). That is, after repeatedly performing the step of supplying the source gas to the edge region (which is the step S200) and the step of supplying the source gas to the central region (which is the step S201) a plurality of times, a subsequent step S101 is performed. As a result, a film of a predetermined thickness is formed on the substrate S provided with the groove. According to the present embodiments, for example, a silicon-containing film is formed.

Figure 12A:
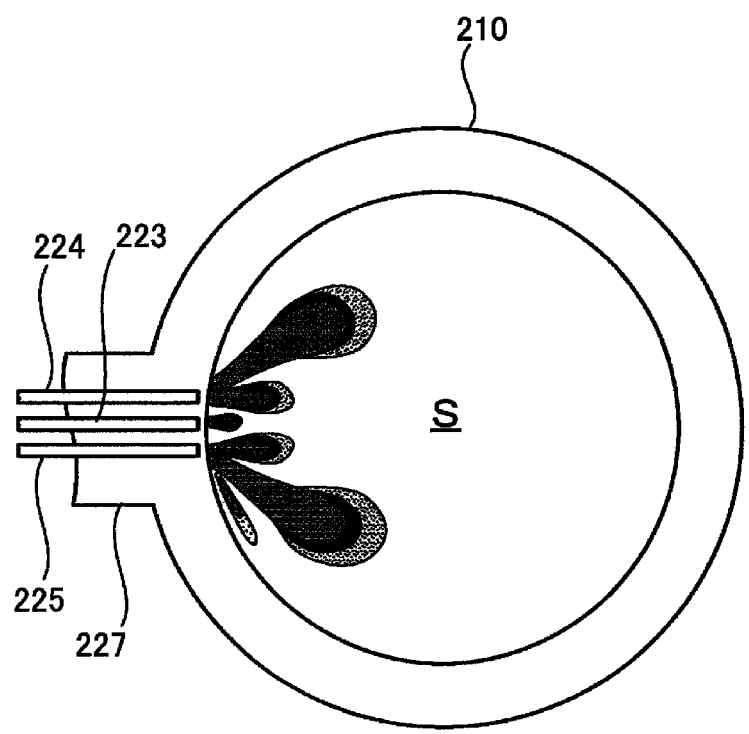
FIG. 12A is a diagram schematically illustrating a gas flow velocity distribution in FIG. 10.

For example, when the HCDS gas is used as the source gas, by performing the step of supplying the source gas to the edge region (which is the step S200), as shown in FIG. 12A, the source gas is supplied faster to the edge region of the substrate S than the central region of the substrate S. In addition, among the HCDS gas supplied into the reaction tube 210, the HCDS gas in the undecomposed state is supplied from the central region of the external zone toward the edge region of the substrate S. As a result, the HCDS gas is supplied into the groove on the surface of the edge region of the substrate S, and collides with the wall constituting the groove. As the HCDS gas collides with the wall, by breaking the Si—Si bond, the $Si_2Cl_6$ (which is the HCDS gas) is decomposed into $SiCl_2$ (which is the precursor). Since the $SiCl_2$ is a substance in the process of forming the film, the $SiCl_2$ may also be referred to as an intermediate substance. Since a molecular size of the $SiCl_2$ decomposed as described above is smaller than that of the HCDS, the $SiCl_2$ easily adheres to the wall constituting the groove. That is, by supplying the HCDS gas in the undecomposed state from the central region of the external zone toward the edge region of the substrate S, the HCDS gas is supplied on the surface of the edge region of the substrate S in the undecomposed state, and collides with the wall constituting the groove. As a result, the HCDS gas in the undecomposed state is supplied on the surface of the edge region of the substrate S, the HCDS gas is decomposed into the $SiCl_2$ in the groove, and the $SiCl_2$ decomposed as described above adheres to the groove.

Figure 12B:
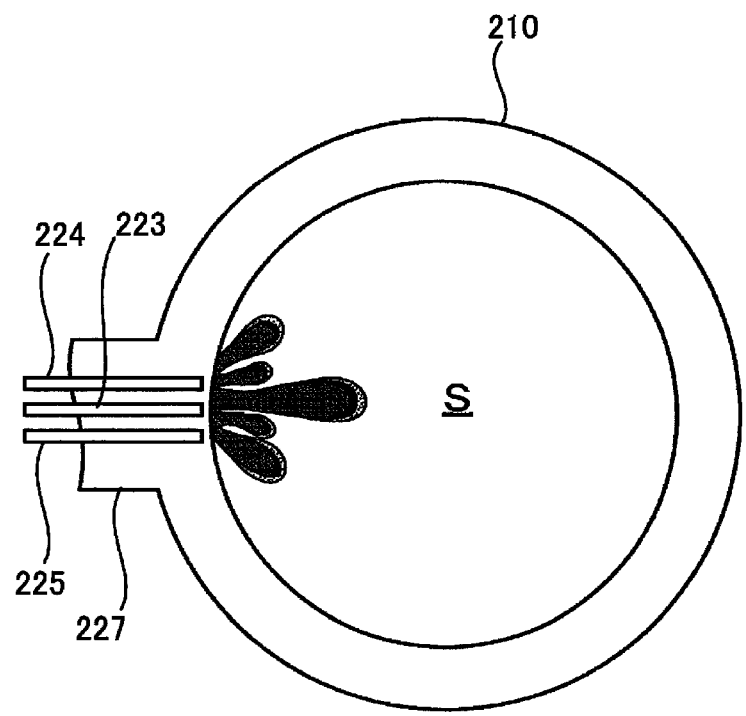
FIG. 12B is a diagram schematically illustrating the gas flow velocity distribution in FIG. 11.

Similarly, by performing the step of supplying the source gas to the central region (which is the step S201), as shown in FIG. 12B, the source gas is supplied faster to the central region of the substrate S than the edge region of the substrate S. In addition, among the HCDS gas supplied into the reaction tube 210, the HCDS gas in the undecomposed state is supplied from the central region of the external zone toward the central region of the substrate S. As a result, the HCDS gas in the undecomposed state is supplied on the surface of the central region of the substrate S, the HCDS gas is decomposed into the $SiCl_2$ in the groove, and the $SiCl_2$ decomposed as described above adheres to the groove.

That is, according to the present embodiments, by repeatedly performing the step of supplying the source gas to the edge region (which is the step S200) and the step of supplying the source gas to the central region (which is the step S201) a plurality of times, the HCDS gas in the undecomposed state is supplied to the surface of the substrate S over the entire region of the substrate S, and collides with the wall constituting the groove. Thereby, it is possible to generate the $SiCl_2$ whose deposition rate is high. As a result, it is possible for the $SiCl_2$ to easily reach a bottom of the groove, and it is also possible to form a silicon-containing film whose step coverage performance is improved.

<Purge Step S101>

After a predetermined time has elapsed from a supply of the source gas, the valve 254 is closed to stop the supply of the source gas. When stopping the supply of the source gas, the valves 258, 268 and 278 are opened to supply the inert gas serving as the purge gas into the gas supply pipes 255, 265 and 275, and with the valve 292 of the exhaust pipe 291 and APC valve 293 left open, the reaction tube 210 is vacuum-exhausted by the vacuum pump 294. As a result, it is possible to suppress a reaction between the source gas and the reactive gas in a gas phase existing in the reaction tube 210.

<Reactive Gas Supply Step S102>

Figure 13:
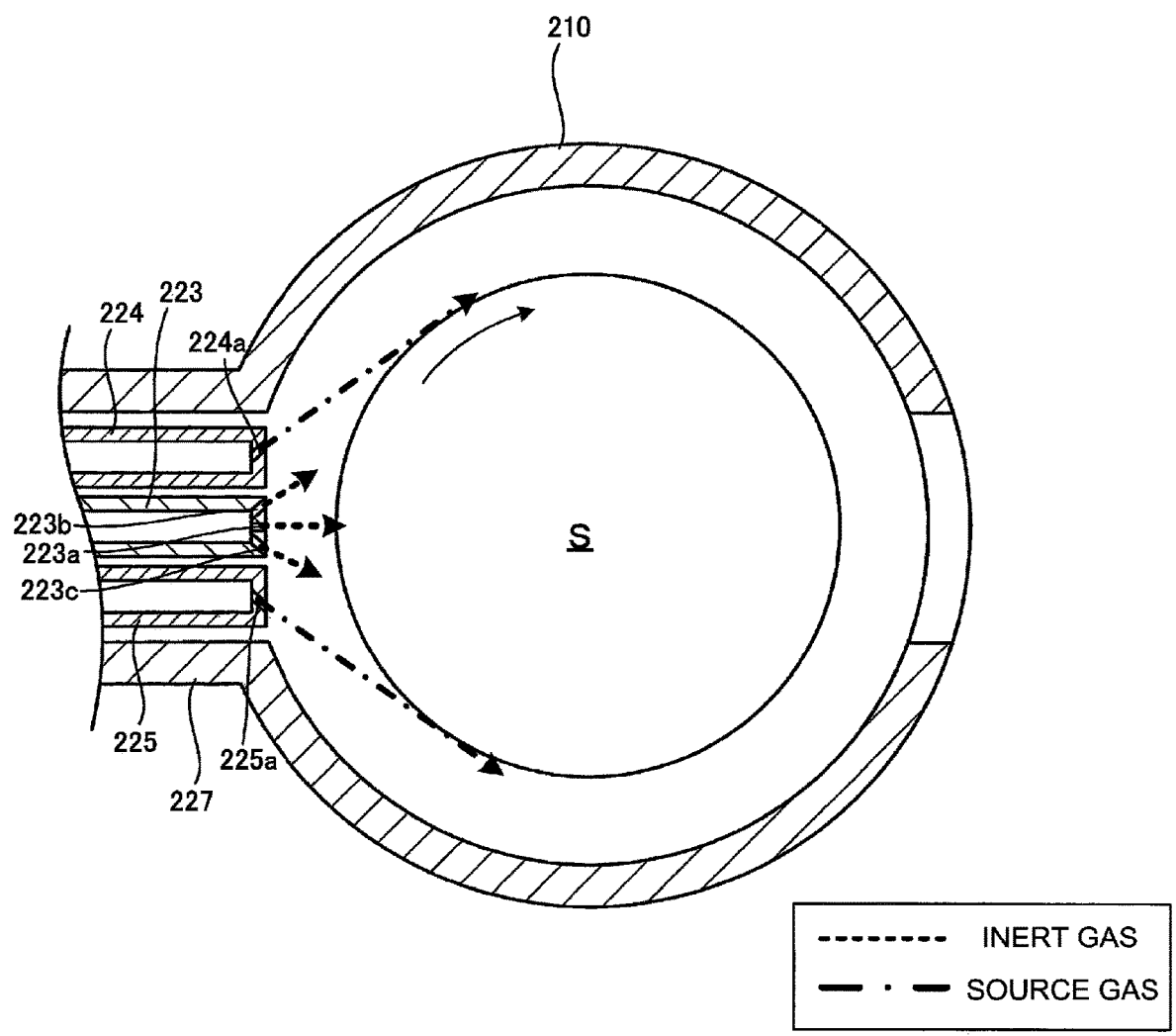
FIG. 13 is a diagram schematically illustrating a reactive gas supply step shown in FIG. 7.

After a predetermined time has elapsed from a start of the purge step S101, the valves 268 and 278 are closed and the valves 264 and 274 are opened so as to supply the reactive gas into the gas supply pipes 261 and 271. As shown in FIG. 13, a flow rate of the reactive gas is adjusted by the MFCs 263 and 273, and the reactive gas whose flow rate is adjusted is supplied into the reaction tube 210 via the distribution structure 125, the nozzle 224, the hole 224a, the nozzle 225 and the hole 225a. Then, the reactive gas is exhausted through the space on the substrate S, the downstream side gas guide 215, the gas exhaust structure 213 and the exhaust pipe 291. When supplying the reactive gas, in order to prevent the reactive gas from entering the gas supply pipe 251, the valve 258 is opened so as to supply the inert gas through the nozzle 223. That is, in the present step, the reactive gas and the inert gas are supplied into the reaction tube 210 as the process gas.

In the present step, the reactive gas is supplied toward the substrate S from the central region of the external zone via the gas supply structure 212. According to the present embodiments, the reactive gas is different from the source gas. As the reactive gas, a gas reacting with the source gas is used. For example, $NH_3$ gas serving as a nitrogen-containing gas may be used. That is, the reactive gas is supplied to the surface of the substrate S from the central region of the external zone. Then, the reactive gas is supplied into the groove and reacts with the precursor adhering to the wall constituting the groove. As a result, a desired film is formed on the substrate S provided with the groove. Specifically, the $NH_3$ gas reacts with the HCDS gas on the surface of the substrate S, and the $NH_3$ gas supplied into the groove reacts with the $SiCl_2$ adhering to the wall constituting the groove to suppress voids. As a result, for example, it is also possible to form a silicon nitride film (SiN film) whose step coverage performance is improved.

<Purge Step S103>

After a predetermined time has elapsed from a supply of the reactive gas, the valves 264 and 274 are closed to stop the supply of the reactive gas. When stopping the supply of the reactive gas, the valves 258, 268 and 278 are opened to supply the inert gas serving as the purge gas into the gas supply pipes 255, 265 and 275, and with the valve 292 of the exhaust pipe 291 and APC valve 293 left open, the reaction tube 210 is vacuum-exhausted by the vacuum pump 294. As a result, it is possible to suppress the reaction between the source gas and the reactive gas in the gas phase existing in the reaction tube 210.

<Performing Predetermined Number of Times: Step S104>

By performing a cycle (in which the step S100 through the step S103 described above are sequentially and non-simultaneously performed in this order) one or more times (that is, a predetermined number of times (n times)), a film of a predetermined thickness is formed on the substrate S provided with the groove. According to the present embodiments, for example, the SiN film is formed. That is, the step of supplying the source gas to the edge region (which is the step S200) and the step of supplying the source gas to the central region (which is the step S201) are performed while the supply of the reactive gas is stopped.

<S14>

Subsequently, a substrate unloading step S14 will be described. In the substrate unloading step S14, the substrate S processed as described above is transferred (unloaded) out of the transfer chamber 217 in the order reverse to that of the substrate loading step S11.

<S15>

Subsequently, a determination step S15 will be described. In the determination step S15, it is determined whether or not a processing described above (that is, the step S11 through S14) has been performed a predetermined number of times. When it is determined that the processing has not been performed the predetermined number of times, the substrate loading step S11 is performed again to process a subsequent substrate S to be processed. When it is determined that the processing has been performed the predetermined number of times, the substrate processing is terminated.

While the present embodiments are described by way of an example in which the horizontal gas flow is formed, the present embodiments are not limited thereto. For example, it is sufficient that a main flow of the gas is generally formed in the horizontal direction. Further, a gas flow diffused in the vertical direction may be formed as long as it does not affect a uniform processing of a plurality of substrates.

Further, in the above, various expressions such as "the same", "equal", "similar" and the like are used. However, it goes without saying that the expressions described above mean "substantially the same one".

Other Embodiments

While the technique of the present disclosure is described in detail by way of the embodiments described above, the technique of the present disclosure is not limited thereto and may be modified in various ways without departing from the scope thereof.

For example, the embodiments described above are described by way of an example in which the step of supplying the source gas to the central region is performed after the step of supplying the source gas to the edge region is performed. However, the technique of the present disclosure is not limited thereto. For example, the step of supplying the source gas to the edge region is performed after the step of supplying the source gas to the central region is performed.

For example, the embodiments described above are described by way of an example in which the same source gas is supplied in both of the step of supplying the source gas to the edge region and the step of supplying the source gas to the central region. However, the technique of the present disclosure is not limited thereto. For example, the technique of the present disclosure may also be applied when the primary constituent (or the main constituent) is the same between the first process gas used in the step of supplying the source gas to the edge region and the second process gas used in the step of supplying the source gas to the central region.

For example, the embodiments described above are described by way of an example in which the nozzles 224 and 225 through which the inert gas is supplied to the edge region of the substrate S are arranged at the lateral sides of the nozzle 223 through which the source gas is supplied such that the transfer velocity of the source gas toward the edge region of the substrate S is increased. However, the technique of the present disclosure is not limited thereto. For example, one or more nozzles through which the source gas is supplied toward the edge region of the substrate S may be further arranged outside the nozzles 224 and 225. That is, three or more nozzles may be arranged substantially in the horizontal direction in the housing 227.

For example, the embodiments described above are described by way of an example in which the step of supplying the source gas to the edge region of the substrate S (in which the source gas in the undecomposed state is supplied to the edge region) and the step of supplying the source gas to the central region of the substrate S (in which the source gas in the undecomposed state is supplied to the central region of the substrate S) are performed such that an amount of the source gas in the undecomposed state and an amount of the source gas in the decomposed state can be set to a constant amount over the entire region of the substrate. However, the technique of the present disclosure is not limited thereto. For example, an adsorption inhibitory gas capable of inhibiting an adsorption of the source gas may be supplied to the edge region of the substrate S to suppress the adsorption of the source gas to the edge region as compared with the central region of the substrate S. Specifically, for example, HCl (hydrogen chloride) may be supplied to the edge region of the substrate S to suppress an excessive adhesion of the source gas in the edge region of the substrate S. After supplying the adsorption inhibitory gas, the source gas is supplied by performing the step of supplying the source gas to the central region (in which the source gas in the undecomposed state is supplied to the central region of the substrate S).

For example, the embodiments described above are described by way of an example in which, in the film processing step performed by the substrate processing apparatus, the film is formed by using the HCDS gas as the source gas and the $NH_3$ gas as the reactive gas. However, the technique of the present disclosure is not limited thereto.

For example, the embodiments described above are described by way of an example in which the film-forming process described above is performed by the substrate processing apparatus. However, the technique of the present disclosure is not limited thereto. That is, the technique of the present disclosure can be applied not only to the film-forming process of forming the film exemplified in the embodiments described above but also to other film-forming processes of forming another film. For example, the embodiments described above are described by way of an example in which the substrate processing apparatus capable of stacking and processing a plurality of substrates is used. However, the technique of the present disclosure is not limited thereto. For example, the technique of the present disclosure can also be applied to a single wafer type substrate processing apparatus capable of processing a single substrate at a time. Further, one or more constituents of the above-described examples may be substituted with one or more constituents of other examples, or may be added to other examples. Further, a part of one or more constituents of the above-described examples may be omitted, or substituted with or added by other constituents.

According to some embodiments of the present disclosure, it is possible to improve the step coverage performance of the film formed on the substrate.

The invention claimed is:

1. A substrate processing method comprising:
   (a1) supplying a first process gas such that a transfer velocity of the first process gas toward an edge region of a substrate is faster than the transfer velocity of the first process gas toward a central region of the substrate;
   (a2) supplying a second process gas such that a transfer velocity of the second process gas toward the central region of the substrate is faster than the transfer velocity of the second process gas toward the edge region of the substrate; and
   (b) supplying a reactive gas toward the substrate.

2. The substrate processing method of claim 1, wherein a primary constituent of the first process gas in (a1) is equal to a primary constituent of the second process gas in (a2).

3. The substrate processing method of claim 1, wherein a source gas contained in the first process gas in (a1) is equal to a source gas contained in the second process gas in (a2).

4. The substrate processing method of claim 1, wherein, in (a1), in parallel with supplying the first process gas at a first flow rate toward the edge region of the substrate, an inert gas is supplied at a second flow rate greater than the first flow rate toward the edge region of the substrate.

5. The substrate processing method of claim 4, wherein, in (a2), in parallel with supplying the second process gas toward the central region of the substrate, the inert gas is supplied at a third flow rate toward the central region of the substrate.

6. The substrate processing method of claim 1, wherein the first process gas in (a1) comprises an adsorption inhibitory gas, and the second process gas in (a2) comprises a gas capable of being adsorbed.

7. The substrate processing method of claim 1, wherein, in (a1), the first process gas is supplied in parallel with supplying an inert gas toward the edge region of the substrate, and after a predetermined time has elapsed, supplying the inert gas toward the edge region is stopped, and
   wherein, in (a2), supplying the inert gas serving as a carrier gas of the second process gas is started while the second process gas is being supplied.

8. The substrate processing method of claim 1, wherein, in (a1), an inert gas reaches the edge region of the substrate more than the first process gas.

9. The substrate processing method of claim 1, wherein (b) is performed after (a1) and (a2) are repeatedly performed a plurality of times.

10. The substrate processing method of claim 1, wherein, in (a1), in parallel with supplying the first process gas toward the edge region of the substrate from a central region of a zone beside a periphery of the substrate, an inert gas is supplied toward the edge region of the substrate from another region of the zone horizontally adjacent to the central region of the zone, and
    wherein, in (a2), the second process gas is supplied toward the central region of the substrate through the central region of the zone beside the periphery of the substrate.

11. The substrate processing method of claim 1, wherein in (a1), in parallel with supplying the first process gas toward the edge region of the substrate from a first gas supplier provided at a central region of a zone beside a periphery of the substrate, an inert gas is supplied toward the edge region of the substrate from a second gas supplier provided at another region of the zone horizontally adjacent to the central region of the zone, and
    wherein, in (a2), the second process gas is supplied toward the central region of the substrate from the first gas supplier.

12. The substrate processing method of claim 11, wherein a hole that opens toward a center of the substrate and a hole that opens toward the edge region of the substrate are provided at a front end of the first gas supplier.

13. The substrate processing method of claim 11, wherein a hole that opens toward the edge region of the substrate is provided at a front end of the second gas supplier.

14. The substrate processing method of claim 11, wherein a third gas supplier is provided horizontally adjacent to the first gas supplier in a manner that the first gas supplier is interposed between the second gas supplier and the third gas supplier, and
    wherein, in (a1), a supply amount of the inert gas supplied from the second gas supplier is equal to a supply amount of the inert gas supplied from the third gas supplier.

15. The substrate processing method of claim 1, wherein each of the first process gas and the second process gas comprises a gas whose properties contain an undecomposed time during which a predetermined decomposition rate is maintained under a predetermined condition and a decomposition time during which a decomposition rate higher than the predetermined decomposition rate is maintained under other predetermined condition.

16. The substrate processing method of claim 1, wherein, in (a2), a carrier gas is supplied in addition to the second process gas for the second process gas to reach the central region of the substrate during an undecomposed time of the second process gas.

17. The substrate processing method of claim 1, wherein, in (a1), a carrier gas is supplied in addition to the first process gas for the first process gas to reach the edge region of the substrate during an undecomposed time of the first process gas.

18. A method of manufacturing a semiconductor device comprising the substrate processing method of claim 1.

19. A non-transitory computer-readable recording medium storing a program that causes, by a computer, a substrate processing apparatus to perform:
- (a1) supplying a first process gas such that a transfer velocity of the first process gas toward an edge region of a substrate is faster than the transfer velocity of the first process gas toward a central region of the substrate;
- (a2) supplying a second process gas such that a transfer velocity of the second process gas toward the central region of the substrate is faster than the transfer velocity of the second process gas toward the edge region of the substrate; and
- (b) supplying a reactive gas toward the substrate.

* * * * *